United States Patent [19]
Vaccaro et al.

[11] Patent Number: 6,081,470
[45] Date of Patent: Jun. 27, 2000

[54] ALL OPTICS TYPE SEMICONDUCTOR IMAGE STORAGE APPARATUS, AND ALL OPTICS TYPE SEMICONDUCTOR LOGICAL OPERATION APPARATUS

[75] Inventors: Pablo Vaccaro, Nara; Kazuhisa Fujita, Ikoma; Makoto Hosoda, Yamatokouriyama; Toshihide Watanabe, Nara, all of Japan

[73] Assignee: ATR Optical & Radio Communications Research Laboratories, Kyoto, Japan

[21] Appl. No.: 08/837,473

[22] Filed: Apr. 18, 1997

[30] Foreign Application Priority Data

Apr. 24, 1996 [JP] Japan ..................................... 8-102532

[51] Int. Cl.[7] ..................................................... G11C 7/00
[52] U.S. Cl. ........................................... 365/215; 365/217
[58] Field of Search ..................................... 365/215, 217

[56] References Cited

U.S. PATENT DOCUMENTS

| | | | |
|---|---|---|---|
| 4,893,273 | 1/1990 | Usami ..................................... | 365/215 |
| 4,922,437 | 5/1990 | Sakata et al. ........................... | 365/215 |
| 5,311,474 | 5/1994 | Urban ..................................... | 365/215 |

OTHER PUBLICATIONS

Thomas H. Barnes et al., "Bistable Optically Writable Image Memory Using Optical Feedback"; Optical Review, vol. 2, No. 2, (1995); pp. 103–105.

D.C. Burns et al., "A 256×256 SRAM–XOR Pixel Ferroelectric Liquid Crystal Over Silicon Spatial Light Modulator"; Optics Communications, 119 (Sep. 15, 1995); pp. 623–632.

Bleuse et al., "Blue Shift of the Absorption Edge in ALGain–AS–Superlattices: Proposal for an Original Electro–optical Modulator"; Dec. 26, 1988; Appl. Phys. Lett.; vol. 53, No. 26; pp. 2632–2634.

J.Y. Marzin et al., "Photoluminescence of Single InAs Quantum Dots Obtained by Self–Organized Growth on GaAs"; Aug. 1, 1994; vol. 73, No. 5, Physical Review Letters; pp. 716–719.

Couturier et al.; "Low Power All–Optical Bistability in InGaAs–AlInAs Superlattices: Demonstration of a Wireless Self–Electro–Optical Effect Device Operating at 1.5. mu m"; *Applied Physics Letters*; Feb. 7, 1994; vol. 64, No. 6; pp. 742–744.

Tominaga et al.; "Self–Electro–Optic Effect Device Using Wannier–Stark Localisation in an Unstrained InGaAs/InAlAs Superlattice Grown on GaAs Substrate"; *Electronics Letters*; May 12, 1994, vol. 30, No. 10; pp. 782–784.

Hosoda et al.; "Optical Differentiator Based on Rapid Collapse of Wannier–Stark Loclization Due to Space Charge Field Screening"; *Applied Physics Letters*; Dec. 5, 1994; vol. 65, No. 23; pp. 2913–2915.

*Primary Examiner*—David Nelms
*Assistant Examiner*—Tuan T. Nguyen

[57] ABSTRACT

An all optics type semiconductor image storage apparatus includes a superlative semiconductor device. The superlattice semiconductor device includes a superlattice layer which is formed by alternately laminating a barrier layer and a quantum well layer. The superlattice layer is interposed between two carrier confinement layers, one of which is formed on a surface of a semiconductor substrate. The superlattice semiconductor device has an effect of modulating a light absorbance in the vicinity of an absorption edge by canceling an internal electric field generated by a piezoelectric effect. This piezoelectric effect is due to a distortion occurring when the superlattice layer is formed. An image is stored so that, light incident into the superlattice semiconductor device at a first stable point is substantially transmitted, while light incident into the device at a second stable point is prevented from being substantially transmitted.

59 Claims, 16 Drawing Sheets

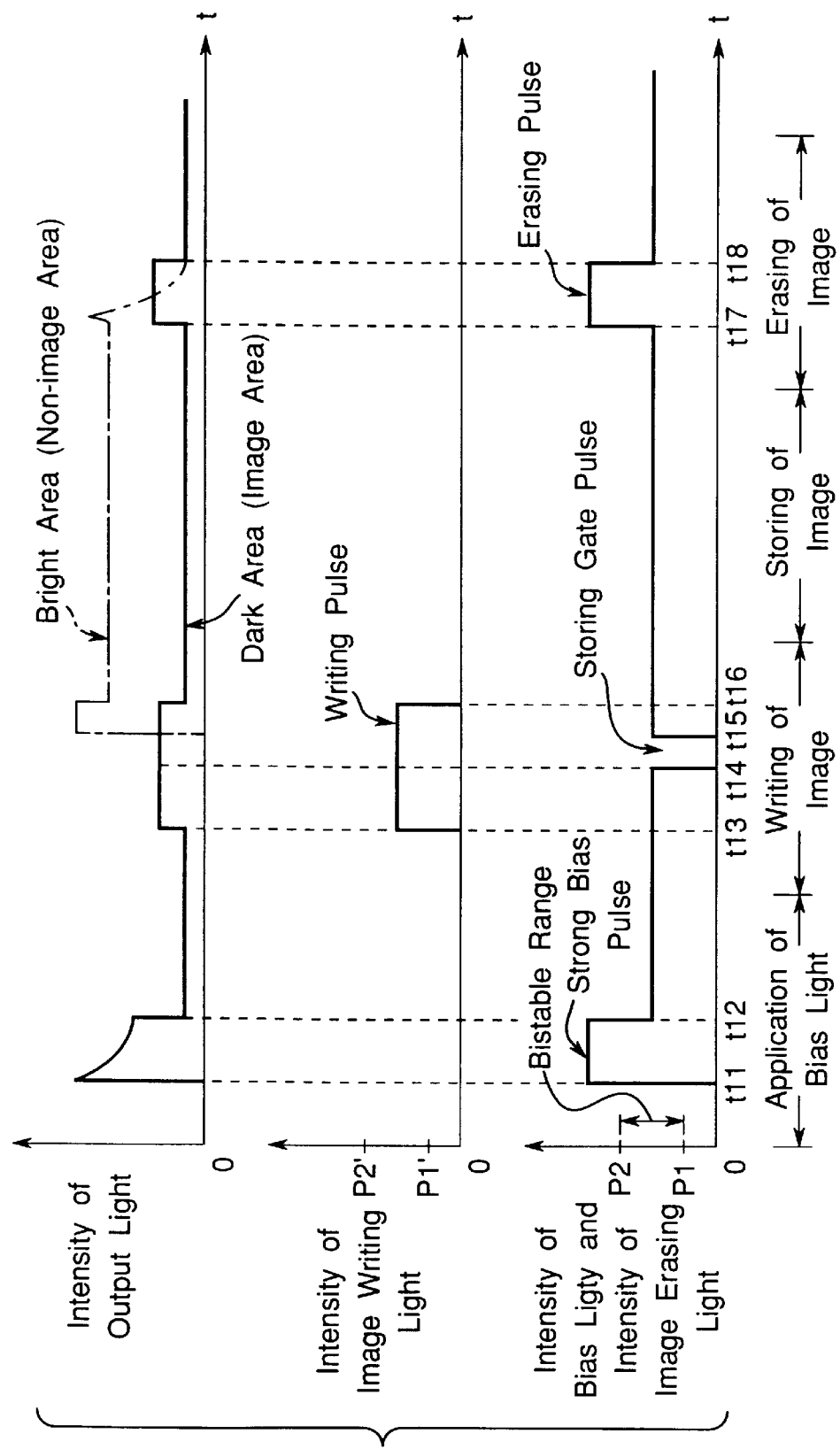

Conditions: $\begin{cases} h < P2 \\ hg < P2 \\ hg + h > P2 \end{cases}$

ALL OPTICS TYPE SEMICONDUCTOR IMAGE STORAGE APPARATUS, AND ALL OPTICS TYPE SEMICONDUCTOR LOGICAL OPERATION APPARATUS

BACKGROUND OF THE INVENTION

1. Field of the Invention

The present invention relates to an all optics type semiconductor image storage apparatus, and an all optics type semiconductor logical operation apparatus, and in particular, to an all optics type semiconductor image storage apparatus and methods for storing and erasing an image, using all light signals by means of a semiconductor diode device having a superlattice structure, and also to an all optics type semiconductor logical operation apparatus and a method for use in a logical operation method for executing a logical operation, using all light signals by means of a semiconductor diode device having a superlattice structure.

2. Description of the Prior Art

An all optics type storage apparatus of a first prior art is disclosed in, for example, a prior art reference document 1 of T. H. Barnes et al., "Bistable optically writable image memory using optical feedback", Optical Review, Vol.2, No.2, pp.103–105, 1995". This first prior art discloses an image storage operation executed by taking advantage of a change of the orientation of liquid crystals occurred when light is applied to its LCD screen. This storage apparatus employs a dual-beam interferometer which has an optical feedback operation exhibiting a threshold operation, a hysteresis operation and a bistable operation.

An all optics type logical operation apparatus of a second prior art is disclosed in, for example, a prior art reference document 2 of D. C. Burns et al., "A 256×256 SRAM-XOR pixel ferroelectric liquid crystal over silicon spatial light modulator", Optics Communications Vol. 119, pp.623–632, 1995". This second prior art is a spatial optical modulator whose address is designated electrically. This optical modulator is formed based on a hybrid technique for mounting ferroelectric liquid crystals on a silicon substrate, and it is provided with an array of 256×256 pixels operating at a frame rate balanced in charge of 2.1 kHz at maximum. A pixel circuit provided with a static random access memory (referred to as a SRAM hereinafter) latch circuit and an exclusive OR (referred to as an XOR hereinafter) gate has an excellent capability in designing one transistor for general use.

The first prior art has had such a problem that the apparatus has a complicated construction, a relatively great pixel size of 33 $\mu$m×33 $\mu$m and a relatively slow response speed of 50 msec. to 100 msec. The second prior art has had such a problem that the apparatus thereof requires an external electrode, a great pixel size of 40 $\mu$m×40 $\mu$m and a relatively slow response speed of 50 ms to 100 msec.

SUMMARY OF THE INVENTION

An essential object of the present invention is to provide an all optics type semiconductor image storage apparatus, capable of reducing the pixel size further than that in the prior art and increasing the process response speed.

Another object of the present invention is to provide methods for storing and erasing an image, capable of reducing the pixel size further than that in the prior art and increasing the process response speed.

A further object of the present invention is to provide an all optics type semiconductor logical operation apparatus, capable of reducing the pixel size further than that in the prior art and increasing the process response speed.

A still further object of the present invention is to provide a method for use in logical operation, capable of reducing the pixel size further than that in the prior art and increasing the process response speed.

In order to achieve the above-mentioned objective, according to one aspect of the present invention, there is provided an all optics type semiconductor image storage apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, and wherein an image is stored so that, the light incident into said superlattice semiconductor device in a first area of said superlattice semiconductor device set at the first stable point is substantially transmitted, while the light incident into said superlattice semiconductor device in a second area of said superlattice semiconductor device set at the second stable point is prevented from being substantially transmitted.

The above-mentioned apparatus preferably further comprises:

a bias light generating circuit for generating a bias light having an intensity, which exceeds the first threshold value P1 and is smaller than the second threshold value P2, and for making the bias light incident into said superlattice semiconductor device; and an image writing light generating circuit for generating and making an image writing light incident into said superlattice semiconductor device so that a sum of an intensity of the bias light and an intensity of the image writing light exceeds the second threshold value P2, when the bias light is incident into said superlattice semiconductor device by the bias light generating circuit, thereby storing an image corresponding to the image writing light into said all optics type semiconductor image storage apparatus.

The above-mentioned apparatus preferably further comprises:

an image erasing control circuit for controlling the bias light generating circuit to stop the bias light from being incident into said superlattice semiconductor device, when the bias light is incident into said superlattice semiconductor device by the bias light generating circuit and then an image is stored thereto by said image writing light generating circuit, thereby erasing said stored image.

The above-mentioned apparatus preferably further comprises:

a bias light generating circuit for generating a first bias light having an intensity that exceeds the threshold value P2, making the first bias light incident into said superlattice semiconductor device, and thereafter, for generating a second bias light having an intensity that exceeds the first threshold value P1 and is smaller than the second threshold value P2, and making the second bias light incident into said superlattice semiconductor device; and an image writing light generating means for generating and making an image writing light incident into said superlattice semiconductor device so that a sum of an intensity of the bias light and an intensity of the image writing light exceeds the second threshold value P2, and for stopping the second bias light from being incident into said superlattice semiconductor device in a part of a time period of generation of the image writing light, thereby storing an image corresponding to the image writing light into said all optics type semiconductor image storage apparatus.

The above-mentioned apparatus preferably further comprises:

an image erasing control circuit for controlling said bias light generating means to make an image erasing light incident into said superlattice semiconductor device so that a sum of the intensity of the second bias light and the intensity of the image erasing light exceeds the second threshold value P2, when the second bias light is incident into said superlattice semiconductor device by said bias light generating circuit and then an image is stored by said image writing light generating circuit, thereby erasing said stored image.

According to another aspect of the present invention, there is provided an all optics type semiconductor image storage apparatus comprising first and second superlattice semiconductor devices, wherein each of the first and second superlattice semiconductor devices comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein each of the first and second superlattice semiconductor devices has an effect of modulating a light absorbance in the vicinity of an absorption edge by cancelling an internal electric field generated by a piezoelectric effect of a distortion taking place when said superlattice layer is formed by carriers generated by light incident externally into each of the first and second superlattice semiconductor devices, wherein said first superlattice semiconductor device is formed on said second superlattice semiconductor device, and wherein said first superlattice semiconductor device has a hysteresis characteristic in which there exist a first stable point having a first light transmittance and a second stable point having a second light transmittance lower than said first light transmittance, for a stable point input intensity between predetermined second and fourth threshold values P11 and P12, in an output intensity of light emitted from said first superlattice semiconductor device when an input intensity of the light incident into said first superlattice semiconductor device is varied, wherein said second superlattice semiconductor device has a hysteresis characteristic in which there exist a first stable point having a first light transmittance and a second stable point having a second light transmittance lower than said first light transmittance, for a stable point input intensity between a first threshold value P21 that is smaller than the second threshold value P11 and a third threshold value P22 that exceeds the second threshold value P11 and is smaller than the fourth threshold value P12, in an output intensity of light emitted from said second superlattice semiconductor device when an input intensity of the light incident into said second superlattice semiconductor device is varied, and wherein a gray scale image is stored by setting the total light transmittance of said first and second superlattice semiconductor devices to a first, second and third light transmittances of at least three steps, so that (a) light incident into said first superlattice semiconductor device in a first area of said first superlattice semiconductor device set at the first stable point is substantially transmitted, (b) light incident into said first superlattice semiconductor device in a second area of said first superlattice semiconductor device set at the second stable point is prevented from being substantially transmitted, (c) light incident into said second superlattice semiconductor device in a third area of said second superlattice semiconductor device set at the second stable point is substantially transmitted, and (d) light incident into said second superlattice semiconductor device in a fourth area of said second superlattice semiconductor device set at the second stable point is prevented from being substantially transmitted.

The above-mentioned apparatus preferably further comprises:

a bias light generating circuit for generating a bias light, having an intensity that exceeds the second threshold value P11 and is smaller than the third threshold value P22, and for making the bias light incident into said superlattice semiconductor devices; and an image writing light generating circuit for generating and making a first image writing light incident into said superlattice semiconductor devices so that a sum of an intensity of the bias light and an intensity of the first image writing light exceeds the fourth threshold value P12, when the bias light is incident into said superlattice semiconductor devices by said bias light generating circuit, thereby storing an image corresponding to the first image writing light into said all optics type semiconductor image storage apparatus at a first light transmittance, and for generating and making a second image writing light incident into said superlattice semiconductor devices so that a sum of the intensity of the bias light and an intensity of the second image writing light exceeds the third threshold value P22 and is smaller than the fourth threshold value P12, when the bias light is incident into said superlattice semiconductor devices by said bias light generating circuit, thereby storing another image corresponding to the second image writing light into said all optics type semiconductor image storage apparatus at a second light transmittance.

The above-mentioned apparatus preferably further comprises:

an image erasing control circuit for controlling the bias light generating circuit to stop the bias light from being incident into said first and second superlattice semiconductor devices, when the bias light is incident into said superlattice semiconductor devices by said bias light generating circuit and then an image is stored by said image writing light generating circuit, thereby erasing said stored image.

The above-mentioned apparatus preferably further comprises:

grooves formed so as to penetrates the superlattice layer located on one carrier confinement layer of said superlattice semiconductor device and another carrier confinement layer in the direction of thickness, thereby forming a plurality of pixel areas.

The above-mentioned apparatus preferably further comprises:

a first buffer layer, a quantum dot layer and a second buffer layer, which are interposed between one carrier confinement layer and said superlattice layer of said superlattice semiconductor device, whereby said quantum dot layer has a plurality of quantum dots corresponding to a plurality of pixel areas.

According to a further aspect of the present invention, there is provided a method for storing an image for use in an all optics type semiconductor image storing apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, and wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, said method including the following steps of:

generating a bias light having an intensity that exceeds the first threshold value P1 and is smaller than the second threshold value P2, and making the bias light incident into said superlattice semiconductor device; and generating and making an image writing light incident into said superlattice semiconductor device so that the sum of the intensity of the bias light and the intensity of the image writing light exceeds the second threshold value P2 when the bias light is made incident into said superlattice semiconductor device, thereby storing an image corresponding to the image writing light into said all optics type semiconductor image storage apparatus.

According to a still further aspect of the present invention, there is provided a method for erasing an image for use in an all optics type semiconductor image storage apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, and wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, said method including the following step of:

stopping a bias light from being incident into said superlattice semiconductor device, when the bias light is incident into said superlattice semiconductor device and then an image is stored, thereby erasing said stored image.

According to a still more further aspect of the present invention, there is provided a method for storing an image for use in an all optics type semiconductor image storing apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, and wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, said method including the following steps of:
generating a first bias light having an intensity that exceeds the threshold value P2, making the first bias light incident into said superlattice semiconductor device and thereafter, generating a second bias light having an intensity that exceeds the first threshold value P1 and is smaller than the second threshold value P2, and making the second bias light incident into said superlattice semiconductor device; and generating and making an image writing light incident into said superlattice semiconductor device so that the sum of the intensity of the second bias light and the intensity of the image writing light exceeds the second threshold value P2, when the second bias light is incident into said superlattice semiconductor device, and stopping the second bias light from being incident into said superlattice semiconductor device in a part of a time period for generation of the image writing light, thereby storing an image corresponding to the image writing light into said all optics type semiconductor image storage apparatus.

According to a more still further aspect of the present invention, there is provided a method for erasing an image for use in an all optics type semiconductor image storage apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, and wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, said method including the following step of:
generating and making an image erasing light incident into said superlattice semiconductor device so that the sum of the intensity of a bias light and the intensity of the image erasing light exceeds the second threshold value P2 when the bias light is incident into said superlattice semiconductor device and then an image is stored, thereby erasing said stored image.

According to a further aspect of the present invention, there is provided a method for storing an image for use in an all optics type semiconductor image storage apparatus comprising first and second superlattice semiconductor devices, wherein each of the first and second superlattice semiconductor devices comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein each of the first and second superlattice semiconductor devices has an effect of modulating a light absorbance in the vicinity of an absorption edge by cancelling an internal electric field generated by a piezoelectric effect of a distortion taking place when said superlattice layer is formed by carriers generated by light incident externally into each of the first and second superlattice semiconductor devices, wherein said first superlattice semiconductor device is formed on said second superlattice semiconductor device, and wherein said first superlattice semiconductor device has a hysteresis characteristic in which there exist a first stable point having a first light transmittance and a second stable point having a second light transmittance lower than said first light transmittance, for a stable point input intensity between predetermined second and fourth threshold values P11 and P12, in an output intensity of light emitted from said first superlattice semiconductor device when an input intensity of the light incident into said first superlattice semiconductor device is varied, wherein said second superlattice semiconductor device has a hysteresis characteristic in which there exist a first stable point having a first light transmittance and a second stable point having a second light transmittance lower than said first light transmittance, for a stable point input intensity between a first threshold value P21 that is smaller than the second threshold value P11 and a third threshold value P22 that exceeds the second threshold value P11 and is smaller than the fourth threshold value P12, in an output intensity of light emitted from said second superlattice semiconductor device when an input intensity of the light incident into said second superlattice semiconductor device is varied, said method including the following steps of:
generating a bias light having an intensity that exceeds the second threshold value P11 and is smaller than the third threshold value P22, and making the bias light incident into said superlattice semiconductor devices;

generating and making a first image writing light incident into said superlattice semiconductor devices so that a sum of an intensity of the bias light and an intensity of the first image writing light exceeds the fourth threshold value P12 when the bias light is incident into said superlattice semiconductor devices, thereby storing an image corresponding to said first image writing light into said all optics type semiconductor image storage apparatus at a first light transmittance; and generating and making a second image writing light incident into said superlattice semiconductor devices so that a sum of the intensity of the bias light and an intensity of the second image writing light exceeds the third threshold value P22 and is smaller than the fourth threshold value P12 when the bias light is incident into said superlattice semiconductor devices, thereby storing an image corresponding to the second image writing light into said all optics type semiconductor image storage apparatus at a second light transmittance.

According to a still further aspect of the present invention, there is provided a method for erasing an image for use in an all optics type semiconductor image storage apparatus comprising first and second superlattice semiconductor devices, wherein each of the first and second superlattice semiconductor devices comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein each of the first and second superlattice semiconductor devices has an effect of modulating a light absorbance in the vicinity of an absorption edge by cancelling an internal electric field generated by a piezoelectric effect of a distortion taking place when said superlattice layer is formed by carriers generated by light incident externally into each of the first and second superlattice semiconductor devices, wherein said first superlattice semiconductor device is formed on said second superlattice semiconductor device, and wherein said first superlattice semiconductor device has a hysteresis characteristic in which there exist a first stable point having a first light transmittance and a second stable point having a second light transmittance lower than said first light transmittance, for a stable point input intensity between predetermined second and fourth threshold values P11 and P12, in an output intensity of light emitted from said first superlattice semiconductor device when an input intensity of the light incident into said first superlattice semiconductor device is varied, wherein said second superlattice semiconductor device has a hysteresis characteristic in which there exist a first stable point having a first light transmittance and a second stable point having a second light transmittance lower than said first light transmittance, for a stable point input intensity between a first threshold value P21 that is smaller than the second threshold value P11 and a third threshold value P22 that exceeds the second threshold value P11 and is smaller than the fourth threshold value P12, in an output intensity of light emitted from said second superlattice semiconductor device when an input intensity of the light incident into said second superlattice semiconductor device is varied, said method including the following step of:

stopping a bias light from being incident into said superlattice semiconductor device when the bias light is incident into said superlattice semiconductor device and then an image is stored, thereby erasing said stored image.

According to a further aspect of the present invention, there is provided an all optics type semiconductor logical operation apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, and wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, said apparatus comprising:

a logical operation device for performing a predetermined logical operation by making at least two input lights having respective logic values incident into said superlattice semiconductor device, thereby outputting an output light representing a result of said logical operation from said superlattice semiconductor device.

In the above-mentioned apparatus, preferably, each of intensities of a first input light and a second input light is smaller than the second threshold value P2, and a sum of the intensity of the first input light and the intensity of the second input light is set so as to exceeds the second threshold value P2, and wherein said logical operation device outputs an output light representing a result of an exclusive OR operation from said superlattice semiconductor device when the first and second input lights are inputted to said superlattice semiconductor device.

In the above-mentioned apparatus, preferably, a sum of intensities of two lights of a first input light, a second input light and a gate light is smaller than the second threshold value P2, and a sum of the intensities of the three lights of the first input light, the second input light and the gate light is set so as to exceeds the second threshold value P2, and wherein said logical operation device outputs an output light representing an operation result of a gated NAND gate device from said superlattice semiconductor device when the first and second input lights are inputted to said superlattice semiconductor device while the gate light is inputted to said superlattice semiconductor device.

In the above-mentioned apparatus, preferably, each of intensities of a first input light, a second input light and a gate light is smaller than the second threshold value P2, and a sum of the intensity of the gate light and the intensity of the first input light or the second input light is set so as to exceeds the second threshold value P2, and wherein said logical operation device outputs an output light representing an operation result of a gated NOR gate device from said superlattice semiconductor device when the first and second input lights are inputted to said superlattice semiconductor device while the gate light is inputted to said superlattice semiconductor device.

According to a still further aspect of the present invention, there is provided a logical operation method for use in an all optics type semiconductor logical operation apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, and wherein each of intensities of a first input light and a second input light is smaller than the second threshold value P2, and a sum of the intensity of the first input light and the intensity of the second input light is set so as to exceeds the second threshold value P2, said method including the following step of:
 inputting the first and second input lights to said superlattice semiconductor device, thereby outputting an output light representing a result of an exclusive OR operation from said superlattice semiconductor device.

According to a still more further aspect of the present invention, there is provided a logical operation method for use in an all optics type semiconductor logical operation apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different from the orientation of the rest (100)

wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, and wherein a sum of intensities of two of a first input light, a second input light and a gate light is smaller than the second threshold value P2, and a sum of the intensities of the three lights of the first input light, the second input light and the gate light is set so as to exceeds the second threshold value P2, said method including the following steps of:
 inputting the gate light to said superlattice semiconductor device; and
 inputting the first and second input lights to said superlattice semiconductor device, thereby outputting an output light representing an operation result of a gated NAND gate device from said superlattice semiconductor device.

According to a still more further aspect of the present invention, there is provided a logical operation method for use in an all optics type semiconductor logical operation apparatus comprising a superlattice semiconductor device, wherein said superlattice semiconductor device comprises a superlattice layer, which is formed by alternately laminating a barrier layer and a quantum well layer, said superlattice layer being interposed between two carrier confinement layers on a surface of a semiconductor substrate having an orientation different than the orientation of the rest of the semiconductor substrate, wherein said superlattice semiconductor device has an effect of modulating a light absorbance in the vicinity of an absorption edge by cancelling an internal electric field generated by a piezoelectric effect due to a distortion taking place when said superlattice layer is formed by carriers generated by light incident externally into the superlattice semiconductor device, wherein said superlattice semiconductor device has a hysteresis characteristic, in which there exist a first stable point having a first light transmittance and a second stable point having a second light transmittance lower than said first light transmittance, for an input intensity at a stable point between predetermined first and second threshold values P1 and P2, in an output intensity of light emitted from said superlattice semiconductor device when an input intensity of the light incident into said superlattice semiconductor device is varied, and wherein each of intensities of a first input light, a second input light and a gate light is smaller than the second threshold value P2, and a sum of the intensity of the gate light and the intensity of the first input light or the second input light is set so as to exceeds the second threshold value P2, said method including the following steps:
 inputting the gate light to said superlattice semiconductor device; and
 inputting the first and second input lights to said superlattice semiconductor device, thereby outputting an output light representing an operation result of a gated NOR gate device from said superlattice semiconductor device.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIGS. 2A and 2B are charts of energy levels showing an operation of the all optics type semiconductor image storage apparatus shown in FIG. 1, wherein FIG. 2A shows an energy level when an internal electric field is generated by a piezoelectric effect, and FIG. 2B shows an energy level when the internal electric field is canceled by light application to recover a mini-band structure;

FIGS. 5A, 5B, 5C and 5D are longitudinal sectional views together with graphs showing an image storing operation I in the all optics type semiconductor image storage apparatus shown in FIG. 1, wherein FIG. 5A shows an operation when a bias light is applied to the device 10, FIG. 5B shows an operation when an image is written into the device 10, FIG. 5C shows an operation when an image is stored and FIG. 5D shows an operation when an image is erased from the device 10;

FIGS. 7A, 7B, 7C and 7D are longitudinal sectional views together with graphs showing an image storing operation II in the all optics type semiconductor image storage apparatus shown in FIG. 1, wherein FIG. 7A shows an operation when a bias light is applied to the device 10, FIG. 7B shows an operation when an image is written into the device 10, FIG. 7C shows an operation when an image is stored and FIG. 7D shows an operation when an image is erased from the device 10;

FIG. 8 is a timing chart showing application timings of a bias intensity, an image writing intensity and an output intensity in the image storing operation II shown in FIGS. 7A to 7D;

DETAILED DESCRIPTION OF THE PREFERRED EMBODIMENTS

Preferred embodiments of the present invention will be described below with reference to the accompanying drawings.

Figure 1:
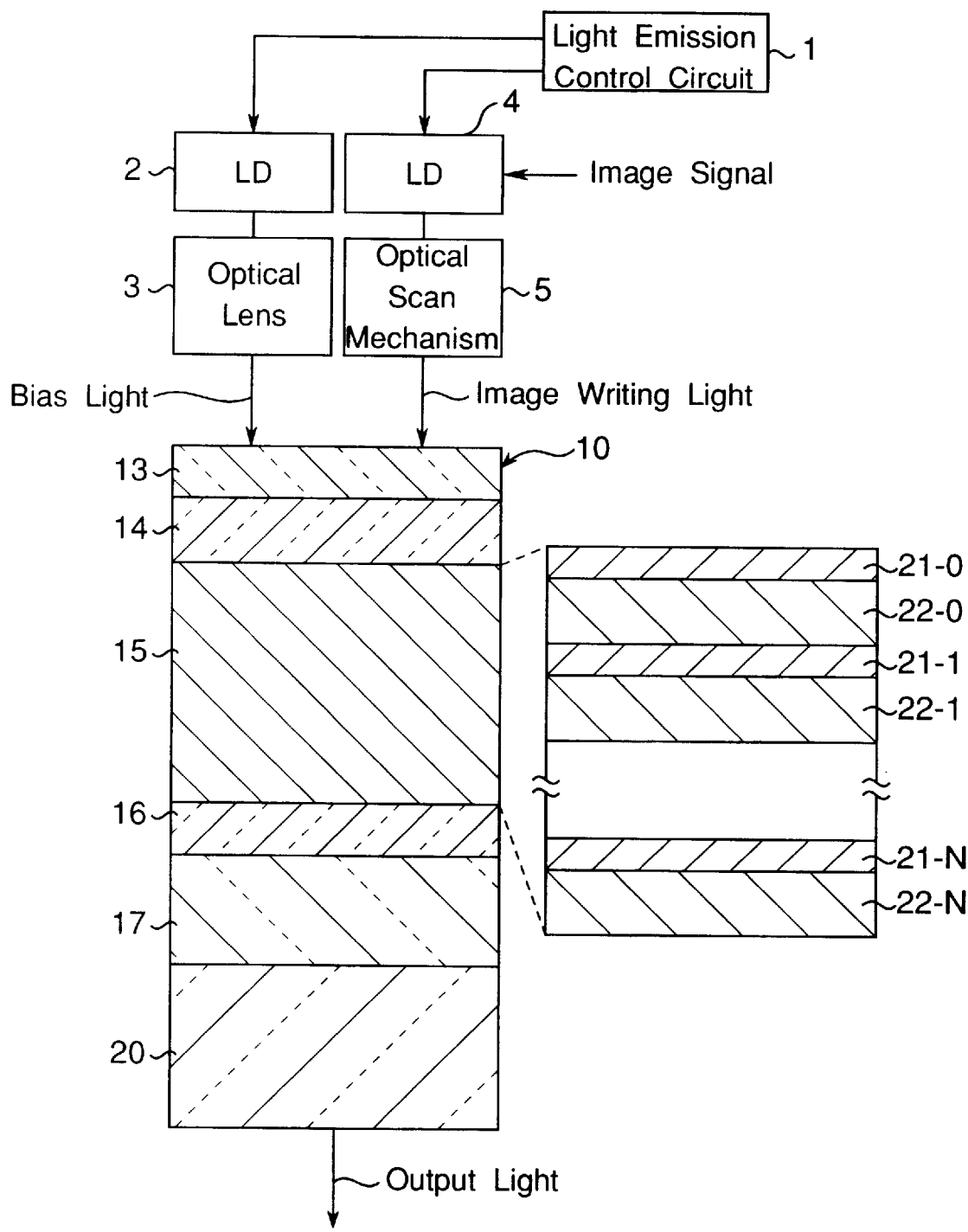
FIG. 1 is a longitudinal sectional view with a block diagram of an all optics type semiconductor image storage apparatus employing a superlattice semiconductor device according to a first preferred embodiment of the present invention.

FIG. 1 is a longitudinal sectional view with a block diagram of an all optics type semiconductor image storage apparatus employing a superlattice semiconductor device 10 according to a first preferred embodiment of the present invention. The all optics type semiconductor image storage apparatus of the present preferred embodiment is provided with a superlattice semiconductor device 10 which is constructed by interposing a superlattice layer 15, which is formed by alternately laminating barrier layers 21-0 to 21-N and quantum well layers 22-0 to 22-N, between two carrier confinement layers 14 and 16 on a surface of an orientation of a semiconductor substrate 20, which is different than the orientation of the rest of the semiconductor substrate 20. The superlattice semiconductor device 10 has an effect of modulating a light absorbance in the vicinity of the absorption edge by cancelling an internal electric field generated by the piezoelectric effect due to a distortion taking place when the superlattice layer 15 is formed by carriers generated by light incident externally into the superlattice semiconductor device 10. The image storage apparatus has a hysteresis characteristic, in which there exist a first stable point B having a first light transmittance and a second stable point E having a second light transmittance lower than the first light transmittance, for an input intensity of a stable point between predetermined first and second threshold values P1 and P2, in the output intensity of light emitted from the superlattice semiconductor device 10 when the input intensity of the light incident onto the superlattice semiconductor device 10 is changed. With this arrangement, an image is stored so that the light incident into the superlattice semiconductor device 10 in a first area of the superlattice semiconductor device 10 set at the first stable point B is allowed to be substantially transmitted and so that the light incident into the superlattice semiconductor device in a second area of the superlattice semiconductor device set at the second stable point E is prevented from being substantially transmitted.

Referring to FIG. 1, the superlattice semiconductor device 10 of the first preferred embodiment is fabricated by forming on the surface of a GaAs semiconductor substrate 20 a GaAs buffer layer 17 and an $Al_{0.5}Ga_{0.5}As$ carrier confinement layer 16, thereafter forming a superlattice layer 15 constructed by alternately laminating $Al_{0.5}Ga_{0.5}As$ barrier layers 21-0 to 21-N (denoted generally by 21 hereinafter) and $In_{0.1}Ga_{0.9}As$ quantum well layers 22-0 to 22-N (denoted generally by 22 hereinafter), and further forming an $Al_{0.5}Ga_{0.5}As$ carrier confinement layer 14 and a cap layer 13.

Figure 2A:
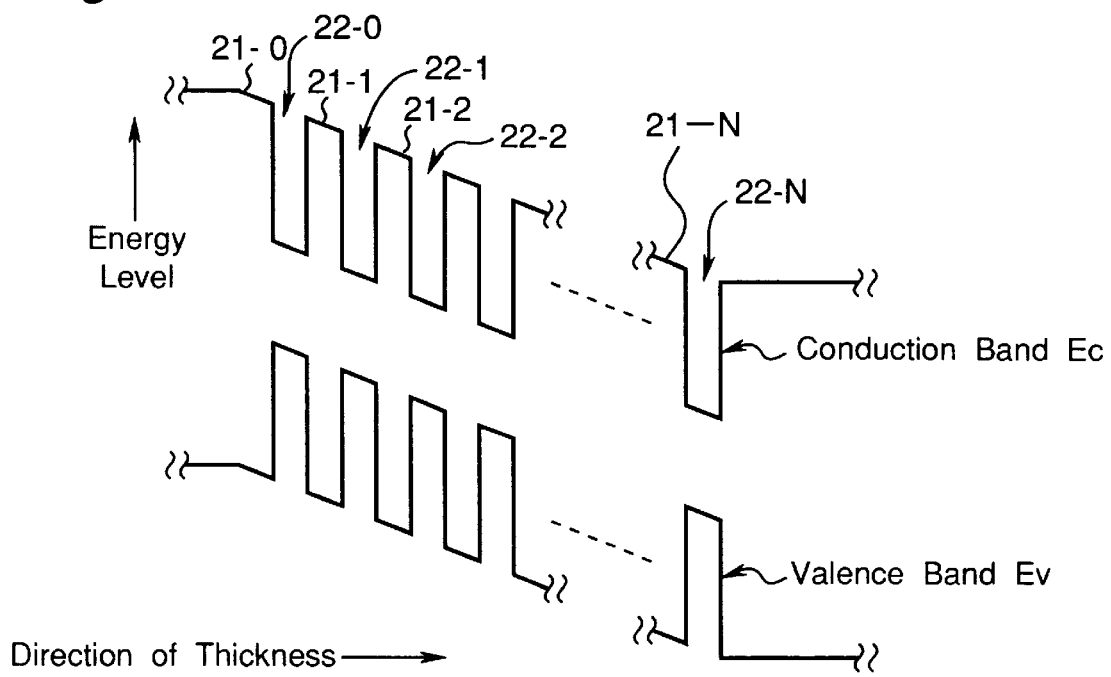
Figure 2B:
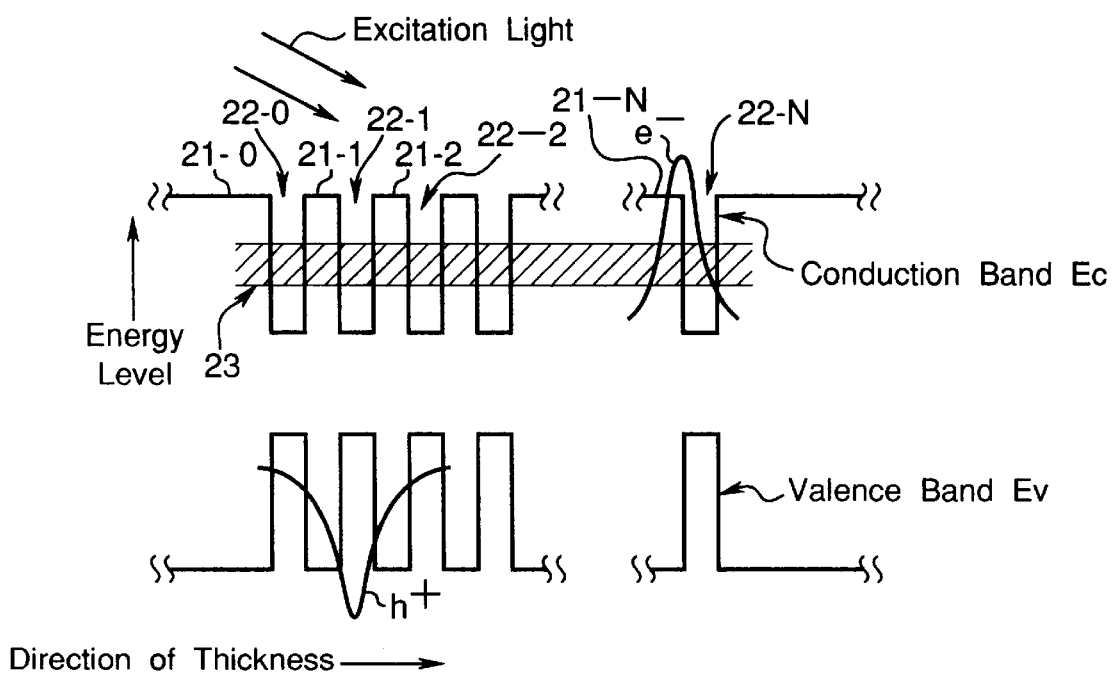

In the present case, by alternately laminating the $In_{0.1}Ga_{0.9}As$ quantum well layers 22-0 to 22-N and the $Al_{0.5}Ga_{0.5}As$ barrier layers 21-0 to 21-N via the GaAs buffer layer 17 and the $Al_{0.5}Ga_{0.5}As$ carrier confinement layer 16 on the surface of semiconductor substrate 20, where the surface has an orientation different than the orientation of the rest of the GaAs semiconductor substrate 20, (i.e., by forming the $In_{0.1}Ga_{0.9}As$ quantum well layer 22 which serves as a distortion layer with respect to GaAs), an internal electric field is generated by the piezoelectric effect due to the distortion stress of the GaAs crystal as shown in FIG. 2A. Consequently, a mini-band 23 is released as shown in FIG. 2B and it comes to locally exist in individual quantum well layers 22-0 to 22-N. This is the Wannier-Stark localization effect (See, for example, a prior art reference document 3 of J. Bleuse et al., "Blue shift of the absorption edge in AlGaInAs-GaInAs superlattices: Proposal for an original electro-optical modulator", Applied Physics Letter, Vol.53, No.26, pp.2632–2634, 1988") which has been known to those skilled in the art. In this case, the light absorbance in the vicinity of the absorption edge at the superlattice layer 15 can be modulated by the variation in intensity of light incident into the superlattice layer 15. Further, by varying the light absorbance, the QCSE (Quantum Confined Stark Effect) which has been known to those skilled in the art can be also used.

Figure 3:
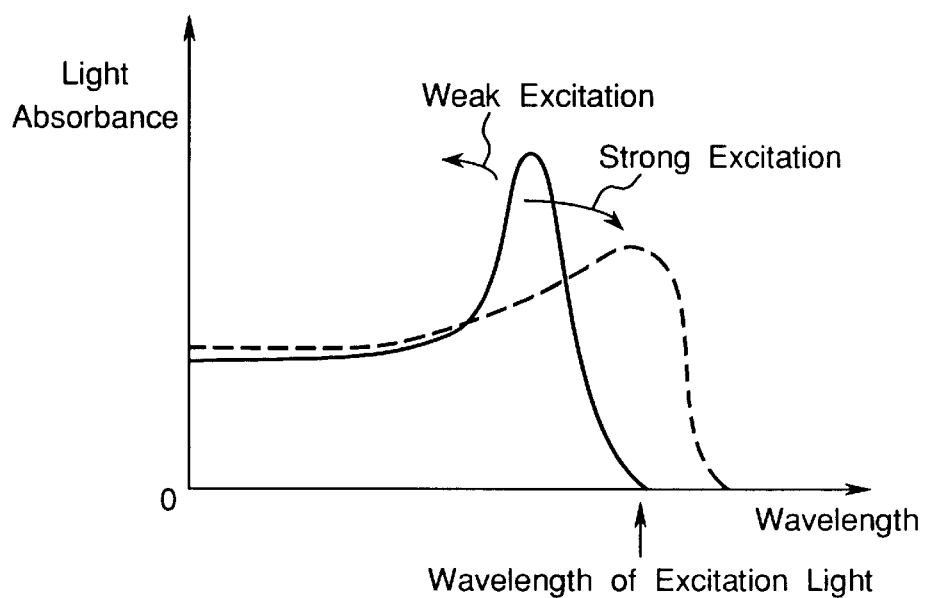
FIG. 3 is a graph showing wavelength characteristics of a light absorbance in the all optics type semiconductor image storage apparatus shown in FIG. 1.

Subsequently, when an excitation light which has an excitation wavelength set longer than the wavelength at the original light absorption edge of the superlattice semiconductor device 10 and causes excitation in the superlattice semiconductor device 10 is incident into the intrinsic semiconductor i-layer 15 having a superlattice structure, a number of carriers generated by the excitation light are confined in the superlattice layer 15 between the carrier confinement layer 16 and the carrier confinement layer 14, and then, serve so that they cancel the internal electric field as shown in FIG. 2B. That is, the superlattice semiconductor device 10 becomes a charge-induced self-feedback apparatus. When the internal electric field is canceled, the wave function of electrons located in each of the quantum well layers 22 spreads to the other quantum well layers 22, so that a mini-band structure denoted by the reference numeral 23 is recovered as shown in FIG. 2B. By this operation, as shown in FIG. 3, the light absorption edge shifts to the lower or red wavelength side (red-shift) to increase the absorption at the light beam wavelength. If the light beam of the excitation light has an intensity greater than the threshold value at which space charge screening can be caused, the superlattice semiconductor device 10 is switched to a higher absorption state as shown in FIG. 3. Subsequently, when the intensity of a beam of excitation light reduces, the optical transition of the superlattice semiconductor device 10 exhibits a hysteresis loop as shown in FIG. 4, so that the device 10 exhibits a bistable state.

Figure 4:
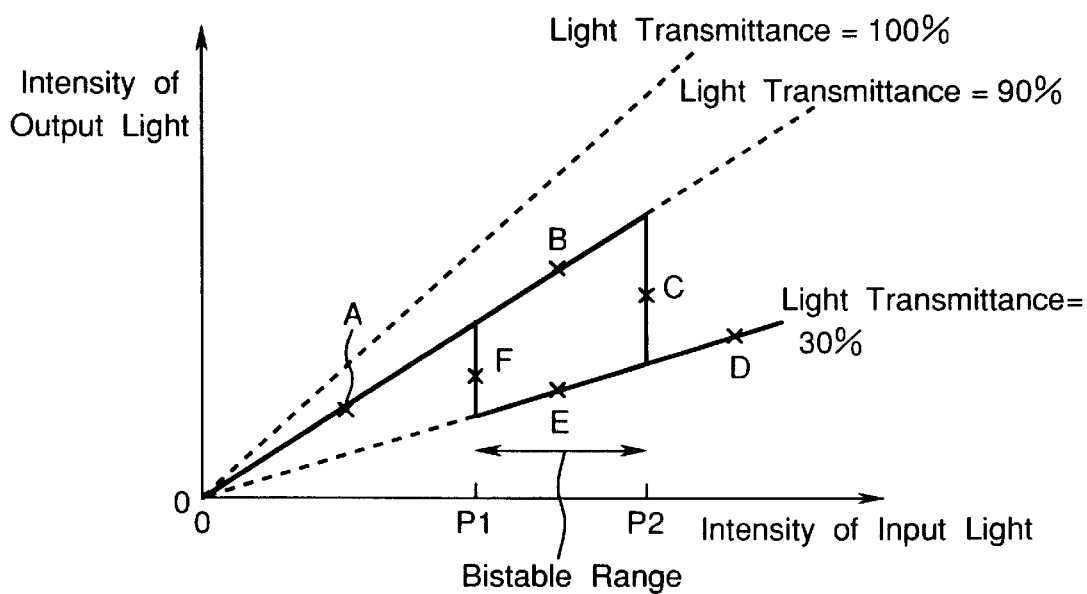
FIG. 4 is a graph showing an output intensity relative to an input intensity in the all optics type semiconductor image storage apparatus shown in FIG. 1.

Referring to FIG. 4, when the intensity of the excitation light is increased from zero, the operating point proceeds from a point A to a point B on, for example, a linear characteristic line where the light transmittance is 90%. When the operating point exceeds the maximum threshold value P2 of the bistable range, the operating point is switched to a state of higher absorption, i.e., a state of lower light transmittance. That is, the operating point proceeds from a point C to a point D. When the intensity of the excitation light is reduced under this state, the operating point returns from the point D to a point E on, for example, a linear characteristic line where the light transmittance is 30%. Further, when the intensity of the excitation light becomes smaller than the minimum threshold value P1 of the bistable state, the operating point returns from the point E via a point F to the point A on the linear characteristic line where the light transmittance is 90%. Therefore, when the intensity P of the excitation light to be applied is within the range of P1<P<P2, there exist two operationally stabilized points at point B and the point E.

A method for manufacturing the superlattice semiconductor device 10 will be described next. Referring back to FIG. 1, the following layers are successively laminated on the surface of the GaAs semiconductor substrate 20 having a thickness of 300 μm from the side near the semiconductor substrate 20 by the metal organic chemical vapor deposition method (MOCVD method) or the molecular beam epitaxy method (MBE method).

The layers includes the followings:

(a) a GaAs buffer layer 17 having a thickness of 300 nm;

(b) an $Al_{0.5}Ga_{0.5}As$ carrier confinement layer 16 having a thickness of 100 nm;

(c) a superlattice layer 15 having a thickness of about 350 μm, which has a superlattice structure obtained by alternately laminating 100 cycles of an $In_{0.1}Ga_{0.9}As$ quantum well layer 22 having a thickness of 2 nm and an $Al_{0.5}Ga_{0.5}As$ barrier layer 21 having a thickness of 1.5 nm;

(d) an $Al_{0.5}Ga_{0.5}As$ carrier confinement layer 14 having a thickness of 100 nm; and (e) a GaAs cap layer 13 having a thickness of 100 nm.

In this case, the superlattice layer 15 is formed on the carrier confinement layer 16 by alternately laminating 100 cycles (i.e., 100 pairs) of the quantum well layer 22 and the barrier layer 21 so that the quantum well layer 22-N is adjacent to the carrier confinement layer 16. It is to be noted that none of the layers 13 to 17 and 20 are doped with any impurities.

With the above-mentioned arrangement, the semiconductor device operates at an operating wavelength of 900 μm to 950 μm. In the present preferred embodiment, the nontransparent wavelengths of the layers 13, 14, 16, 17 and 20 made of GaAs or AlGaAs ranges from 850 µm to 900 µm. Therefore, when the superlattice layer 15 is in the transparent state, the light signal having the above-mentioned operating wavelength is transmitted through the device 10 and is outputted therefrom.

In the present preferred embodiment, the internal electric field caused by the piezoelectric effect is required to be not smaller than 80 kV/cm. Further, the quantum well layer 22 may be made of $In_xGa_{1-x}As$, while the barrier layer 21 may be made of $Al_yGa_{1-y}As$. In the present case, it is preferred to control the generation of a defect due to a distortion in the quantum well layer 22, and it is preferred that x should fall within a range of $0.01<x<0.20$. It is more preferable that x should fall within a range of $0.1<x<0.20$.

In the present preferred embodiment, the buffer layer 17 is formed on the surface of the GaAs semiconductor substrate 20.

Figure 5D:
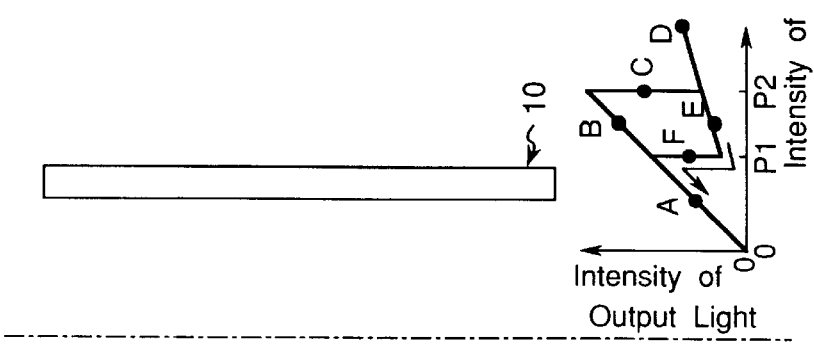
Figure 5C:
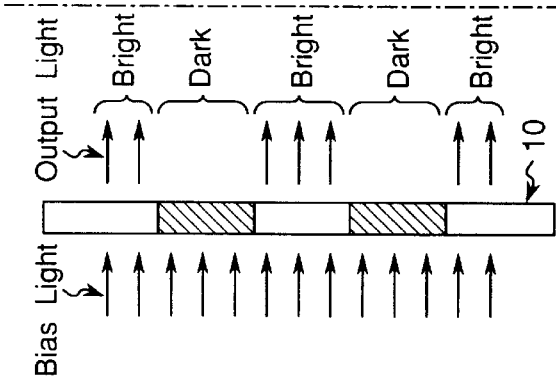
Figure 5B:
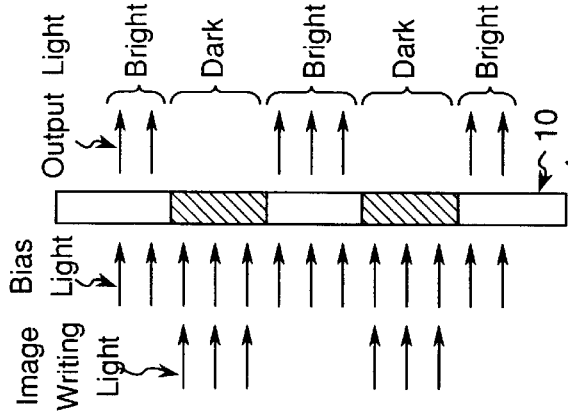
Figure 5A:
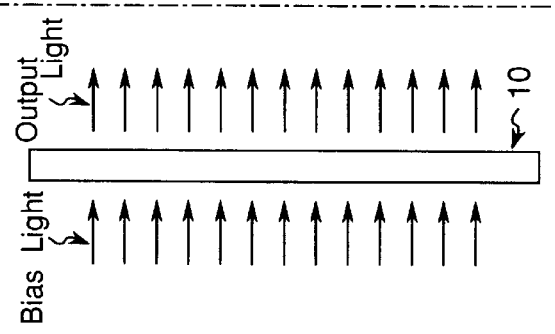

FIGS. 5A, 5B, 5C and 5D are longitudinal sectional views together with graphs showing an image storing operation I in the all optics type semiconductor image storage apparatus shown in FIG. 1, where FIG. 5A shows an operation when a bias light is applied to the device 10, FIG. 5B shows an operation when an image is written into the device 10, FIG. 5C shows an operation when an image is stored and FIG. 5D shows an operation when an image is erased from the device 10.

Referring back to FIG. 1, a light emission control circuit 1 controls the emission intensity or the emission intensity and the emission time interval of a laser diode 2 for emitting a bias light, and also controls the emission intensity or the emission intensity and the emission time interval of a laser diode 4 for emitting an image writing light. The bias light emitted from the laser diode 2 is collimated so as to be radiated onto the entire incident surface of the cap layer 13 of the device 10 by an optical lens 3 implemented by, for example, a convex lens, and then is made to be perpendicularly incident onto the incident surface of the device 10. On the other hand, the laser diode 4 modulates in intensity the emitted image writing light according to an inputted, image signal so as to make the intensity-modulated image writing light incident onto the incident surface by scanning the light in the main scanning direction or the sub-scanning direction by means of an optical scan mechanism 5 such as a pivoting polygon mirror or the like.

Figure 6:
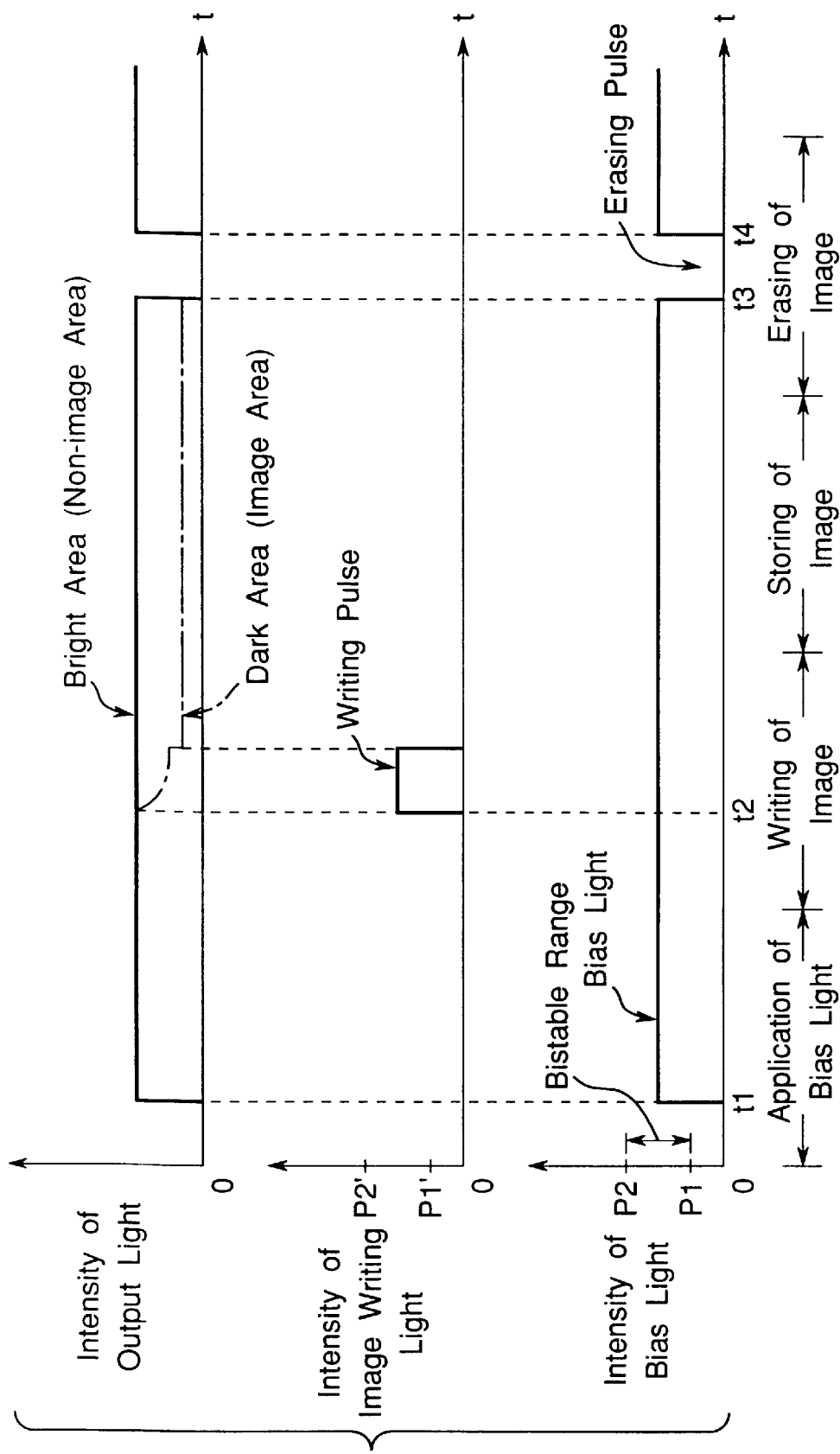
FIG. 6 is a timing chart showing application timings of a bias intensity, an image writing intensity and an output intensity in the image storing operation I shown in FIGS. 5A to 5D.

FIG. 6 is a timing chart showing application timings of a bias intensity, an image writing intensity and an output intensity in the image storing operation I shown in FIGS. 5A to 5D. An image storing operation I capable of two-dimensionally storing an image will be described below with reference to FIGS. 5A to 5D and 6.

First of all, at a timing t1, a bias light having an excitation wavelength having an intensity which is within the above-mentioned bistable range, i.e., greater than the threshold value P1 and smaller than the threshold value P2 is applied from the entire upper surface of the cap layer 13 of the superlattice semiconductor device 10 onto the superlattice layer 15. In this stage, as shown in FIG. 5A, the operating point is retained at the point B on the graph of the input and output intensities, and the bias light is transmitted through the device 10 and then is outputted from the device 10. In this state, at a timing t2, a writing pulse of the image writing light having an image of a density and having the same wavelength as that of the bias light is irradiated onto the device 10 as shown in FIG. 5B. In this stage, the intensity of the light is made great enough so that the sum of the intensity of the bias light and the intensity of the image writing light exceeds the threshold value P2 in order to cause a transition from the high transparent state to the low transparent state or absorption state, so that the operating point is located at the point D as shown in FIG. 5B in the stage of applying the image writing light. In this case, the image writing light having a density image is, for example, a reflected light obtained by applying light on an original document and being reflected on the original document as in a laser printer of a copying machine. The area into which the image writing light is applied comes to have a reduced light transmittance to interrupt the light (corresponding to a dark area or image area shown in FIG. 6) as shown in FIG. 5B. On the other hand, the area into which the image writing light is not applied is retained in the high light transmittance state (corresponding to a bright area or non-image area shown in FIG. 6), i.e., the operating point is retained at the point B as shown in FIG. 5B. That is, the image read in this stage is the negative image of the inputted image.

After the application of the light pulse of the image writing light, the operating point of the light absorption is located at the point E in FIG. 4C, and then the image of the image writing light is stored into the device 10. In this case, the operating point of the area on which no light has been incident is located at the operating point B. In this state, since the bias light is applied into the device 10, the image can be read as shown in FIG. 5C. When the image writing light is incident with the stored image retained, the subsequent image can be stored in addition to the area in which the storage has been effected previously. Therefore, the device 10 can be used for the input of the subsequent image. Further, when erasing the bias light at a timing t3, the operating point returns from the point F via the point A to the origin as shown in FIG. 5D. Therefore, the stored image is erased, and the whole of the device 10 is put back to the transparent state again.

Figure 7D:
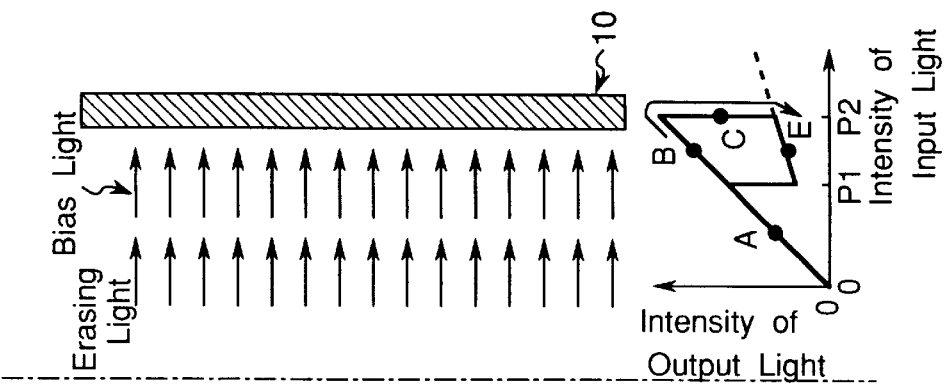
Figure 7C:
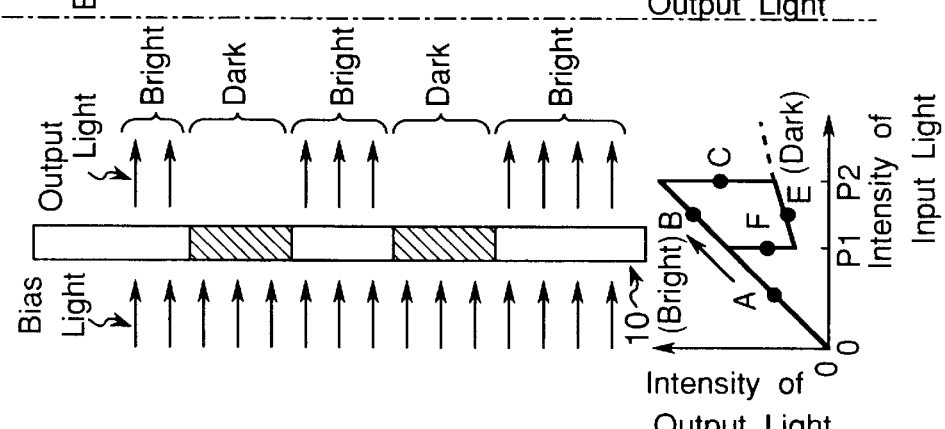
Figure 7B:
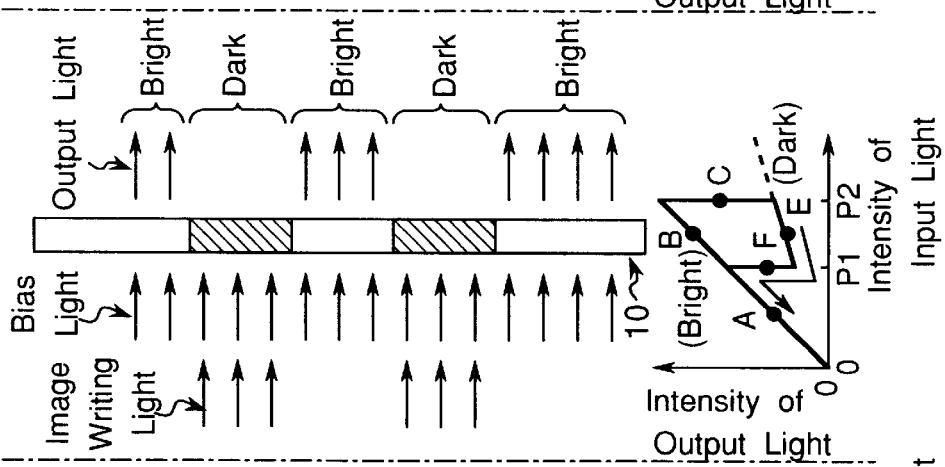
Figure 7A:
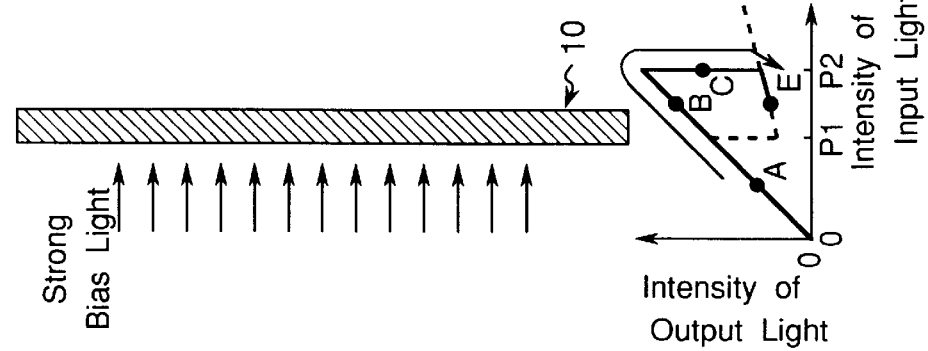

FIGS. 7A, 7B, 7C and 7D are longitudinal sectional views together with graphs showing an image storing operation II in the all optics type semiconductor image storage apparatus shown in FIG. 1, wherein FIG. 7A shows an operation when a bias light is applied into the device 10, FIG. 7B shows an operation when an image is written, FIG. 7C shows an operation when an image is stored in the device 10, and FIG. 7D shows an operation when an image is erased from the device 10. FIG. 8 is a timing chart showing application timings of a bias intensity, an image writing intensity and an output intensity in the image storing operation II shown in FIGS. 7A to 7D. The image storing operation II will be described with reference to FIGS. 7A to 7D and 8. In FIG. 8, in order to clarify the elapse of time, there are provided timing numbers t11 to t18 according to the elapse of time.

First of all, as shown in FIG. 7A, a bias light having an intensity which exceeds the threshold value P2 and having an excitation wavelength is applied to the whole of the device 10 at a timing t11. In this stage, the intensity of the light is made great enough to cause a transition from the high transparent state to the low transparent state or absorption state. Subsequently, the intensity is set to a value that exceeds the threshold value P1 and is smaller than the threshold value P2 to retain the operating point at the point E. Therefore, the operating point in this stage reaches from the point A via the point B and the point C to the point E, when the whole of the device 10 is put in the nontransparent state to output no output light. Then, as shown in FIG. 7B, while a writing pulse of a strong image writing light which exceeds the threshold value P2 is applied from a timing t1 to a timing t16, the bias light is removed for a short time interval from a timing t14 to a timing t15. That is, there is applied a short-time storing gate pulse for erasing the image in the area to which the image writing light is not applied as shown in FIG. 8. Therefore, by turning off the bias light in a short time interval, the area to which no image writing light has been inputted is switched to a transparent state, i.e., the operating point shifts to the point B, so that the area becomes the bright area or non-image area. On the other hand, the area to which the image writing light is inputted retains the nontransparent state (the operating point is at the point E, i.e., the dark area or image area). That is, as shown in FIG. 7C, by restoring the bias light after erasing gate pulse, the inputted image including the two areas of the bright area and the dark area is retained and stored in a form of a negative image. Further, in addition to the bias light, an erasing light is applied to the device 10 such that the sum of the intensity of the bias light and the intensity of the erasing light exceeds the threshold value P2, and then, the operating point in the area where the image has been stored shifts from the point B via the point C to the point E as shown in FIG. 7D. By this operation, the whole of the device 10 becomes the dark area to erase the image.

A method for setting a light excitation threshold value Ith for the maximum input intensity P2 (See FIG. 4) of the bistable range in the above-mentioned preferred embodiment will be described below. In the present case, the light excitation threshold value Ith is the number of photons when the light transmittance varies from 90% to 30% as shown in FIG. 4, i.e., the number of photons relative to the input threshold value intensity P2.

In the present case, in order to switch the superlattice semiconductor device 10, carriers amounting to the number Nth of threshold values are required to be in the stationary state. The number N-th of threshold values is approximately equal to a polarization charge P. For example, when the quantum well layer 22 is made of $In_{0.10}Ga_{0.90}As$ and the barrier layer 21 is made of GaAs in the first preferred embodiment, the polarization charge P (or the number of carriers per unit dimensions) is about $1.1 \times 10^{12}$ carriers/cm$^2$, and this corresponds to an electric field intensity E of 150 kV/cm. The carrier density in the stationary state can be expressed by the following equation:

$$dn/dt = g - r = 0 \quad (1),$$

where $$g = I \cdot \alpha \quad (2),$$

and $$r = n/\tau_{rec} \quad (3),$$

where I represents a light excitation intensity,

α represents a light absorption coefficient inversely proportional to the light transmittance, n represents the number of carriers, and $\tau_{rec}$ represents a recombination time.

Therefore, according to these equations, the light excitation threshold value Ith is expressed by the following equation:

$$Ith = Nth/(\alpha \cdot \tau_{rec}) \approx P/(\alpha \cdot \tau_{rec}) \quad (4).$$

In the above equation, when the wavelength of the operating light λ=950 nm, an energy value hv=1.3 eV, and this corresponds to about $2.1 \times 10^{-19}$ J/photon. If the light absorption coefficient α=10% and the recombination time $\tau_{rec}$=100 nsec, the light excitation threshold value Ith is expressed by the following equation:

$$Ith = 1.1 \times 10^{20} \text{ photon/cm}^2 = 23 \text{ W/cm}^2 \quad (5)$$

As is apparent from the equation (4), the light excitation threshold value Ith varies according as the recombination time $\tau_{rec}$ varies. In the present case, the recombination time $\tau_{rec}$ can be varied by varying a growth temperature or an arsenic (As) pressure when growing the crystal of the superlattice layer 15. Therefore, the light excitation threshold value Ith of the superlattice semiconductor device 10 can be variably set by changing the growth temperature or the set pressure.

In the above-mentioned preferred embodiment, the superlattice semiconductor device 10 is provided with the GaAs semiconductor substrate 20, the GaAs buffer layer 17, the $Al_{0.5}Ga_{0.5}As$ carrier confinement layer 16, the superlattice layer 15 having a superlattice structure constructed by alternately laminating 100 cycles of the $In_{0.1}Ga_{0.9}As$ quantum well layer 22 and the $Al_{0.5}Ga_{0.5}As$ barrier layer 21, the $Al_{0.5}Ga_{0.5}As$ carrier confinement layer 14 and the GaAs cap layer 13. However, the device 10 can be provided with the following compositions and materials.

(a) A superlattice semiconductor device 10 having an operating wavelength of 980 nm to 990 nm is provided with a GaAs semiconductor substrate 20, a GaAs buffer layer 17, an $Al_{0.5}Ga_{0.5}As$ carrier confinement layer 16, a superlattice layer 15 having a superlattice structure constructed by alternately laminating 100 cycles of an $In_{0.15}Ga_{0.85}As$ quantum well layer 22 having a thickness of 100 Å and a GaAs barrier layer 21 having a thickness of 150 Å, an $Al_{0.5}Ga_{0.5}As$ carrier confinement layer 14 and a GaAs cap layer 13.

(b) A superlattice semiconductor device 10 having an operating wavelength of 700 nm to 775 nm is provided with a GaAs semiconductor substrate 20, a GaAs buffer layer 17, an $Al_{0.5}Ga_{0.5}As$ carrier confinement layer 16, a superlattice layer 15 having a superlattice structure constructed by alternately laminating 100 cycles of a CdTe quantum well layer 22 having a thickness of 75 Å and a $Zn_{0.14}Cd_{0.86}Te$ barrier layer 21 having a thickness of 100 Å, an $Al_{0.5}Ga_{0.5}As$ carrier confinement layer 14 and a GaAs cap layer 13.

(c) A superlattice semiconductor device 10 having an operating wavelength of 1515 nm to 1530 nm is provided with an InP semiconductor substrate 20, an InP buffer layer 17, an InP carrier confinement layer 16, a superlattice layer 15 having a superlattice structure constructed by alternately laminating 100 cycles of an $In_{0.63}Ga_{0.37}As$ quantum well layer 22 having a thickness of 50 Å and an InP barrier layer 21 having a thickness of 125 Å, an InP carrier confinement layer 14 and a GaAs cap layer 13.

(d) A superlattice semiconductor device 10 having an operating wavelength of 400 nm to 480 nm is provided with a ZnSe semiconductor substrate 20, a ZnSe buffer layer 17, a ZnSe carrier confinement layer 16, a superlattice layer 15 having a superlattice structure constructed by alternately laminating 100 cycles of a $Zn_{0.88}Cd_{0.12}Se$ quantum well layer 22 having a thickness of 60 Å and a ZnSe barrier layer 21 having a thickness of 150 Å, a ZnSe carrier confinement layer 14 and a ZnSe cap layer 13.

In the above-mentioned preferred embodiment, the superlattice semiconductor device 10 takes advantage of the Wannier-Stark effect in order to obtain a bistable state by hysteresis. However, the superlattice semiconductor device 10 of the present invention may be implemented by taking advantage of the Quantum Confined Stark Effect (QCSE) described as follows.

This device comprises a mixed crystal of GaAs, InAs and AlAs grown as a crystal on a GaAs (111)A or GaAs (111)B substrate. In a manner similar to that of the construction shown in FIG. 1, the device comprises the following layers:

(a) a GaAs buffer layer 17 having a thickness of 300 nm;

(b) an $Al_{0.5}Ga_{0.5}As$ carrier confinement layer 16 having a thickness of 100 nm;

(c) a superlattice layer 15 formed by alternately laminating 100 cycles of an $In_{0.05}Ga_{0.95}As$ quantum well layer 22 having a thickness of 9 nm and an $Al_{0.2}Ga_{0.8}As$ barrier layer 21 having a thickness of 10 nm;

(d) an $Al_{0.5}Ga_{0.5}As$ carrier confinement layer 14 having a thickness of 100 nm; and (e) a GaAs cap layer 13 having a thickness of 100 nm.

In the present case, none of the layers 13 to 17 and 20 are doped with impurities. In this case, the wavelength of the excitation light is set smaller than the wavelength at which the absorption occurs. A number of carriers generated by the excitation light incident into the superlattice layer 15 flow out of the quantum well layer 22 to operate in a manner that they cancel an electric field generated by the piezoelectric effect. When the electric field is canceled, a shift to the longer wavelength due to the QCSE effect of an exciton peak is reduced to increase the absorption at the light beam wavelength. If the excitation light retains an intensity greater than the threshold value, the superlattice semiconductor device 10 is switched to the high absorption state. Further, when the intensity of the excitation light is reduced, the optical transition of the device describes a hysteresis loop to exhibit a bistable state.

Although the reference numerals 14 and 16 denote the carrier confinement layers in the above-mentioned preferred embodiment, each of them may denote a clad layer.

Figure 9:
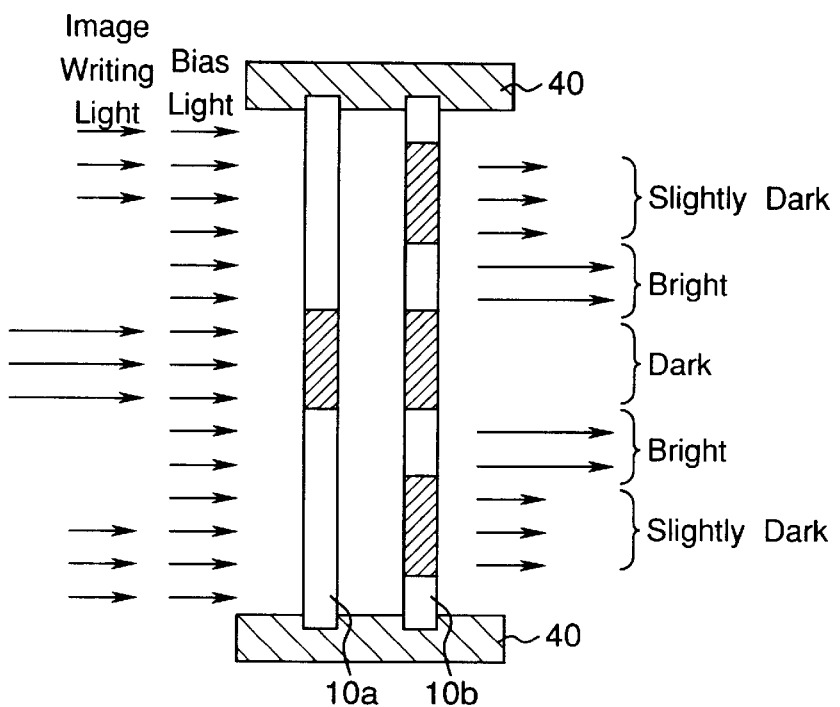
FIG. 9 is a longitudinal sectional view of an all optics type semiconductor image storage apparatus employing a superlattice semiconductor device according to a second preferred embodiment of the present invention.

FIG. 9 is a longitudinal sectional view of an all optics type semiconductor image storage apparatus employing a superlattice semiconductor device according to a second preferred embodiment of the present invention.

Figure 10A:
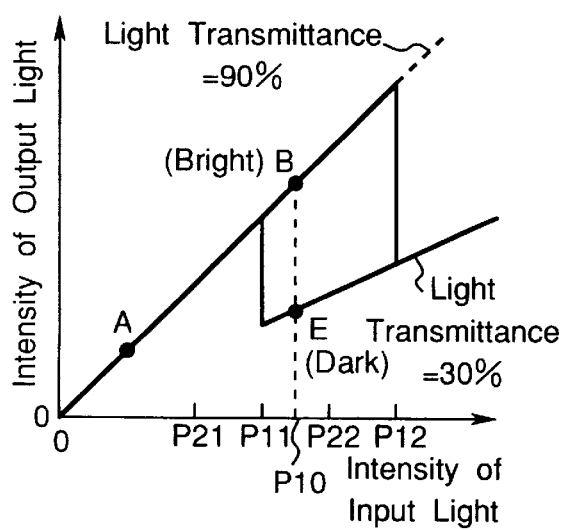
FIG. 10A is a graph showing an input to output intensity characteristic of a device 10a as shown in FIG. 9.
Figure 10B:
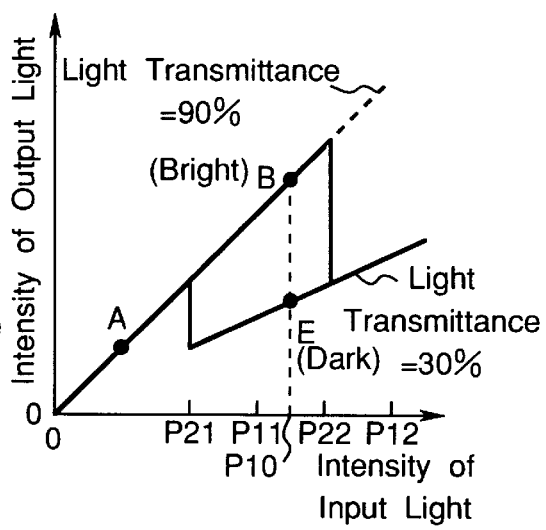
FIG. 10B is a graph showing an input to output intensity characteristic of a device 10b as shown in FIG. 9.

Referring to FIG. 9, this second preferred embodiment is provided with two superlattice semiconductor devices of the first preferred embodiment. In the present case, the superlattice semiconductor devices 10a and 10b are supported by support device 40 so that their input and output surfaces are arranged in parallel with each other, and the input light to output light intensity characteristic of the superlattice semiconductor device 10a and that of the superlattice semiconductor device 10b are made so as to be different from each other by a method for varying the above-mentioned light excitation threshold value Ith as shown in FIGS. 10A and 10B. That is, the device 10a has a threshold value P11 corresponding to the threshold value P1 of the first preferred embodiment and a threshold value P12 corresponding to the threshold value P2 of the first preferred embodiment, while the device 10b has a threshold value P21 corresponding to the threshold value P1 of the first preferred embodiment and a threshold value P22 corresponding to the threshold value P2 of the first preferred embodiment. In this case, the intensity of the bias light is assumed to be P10 within a range of $P21<P11<P10<P22<P12$.

In the second preferred embodiment shown in FIG. 9, the device on the light entry side is denoted by the reference numeral 10a and the light exit side is denoted by the reference numeral 10b. However, the present invention is not limited to this, and one devices 10a and 10b may be exchanged for each other. Otherwise, the device 10a may be formed directly on the device 10b.

Figure 11:
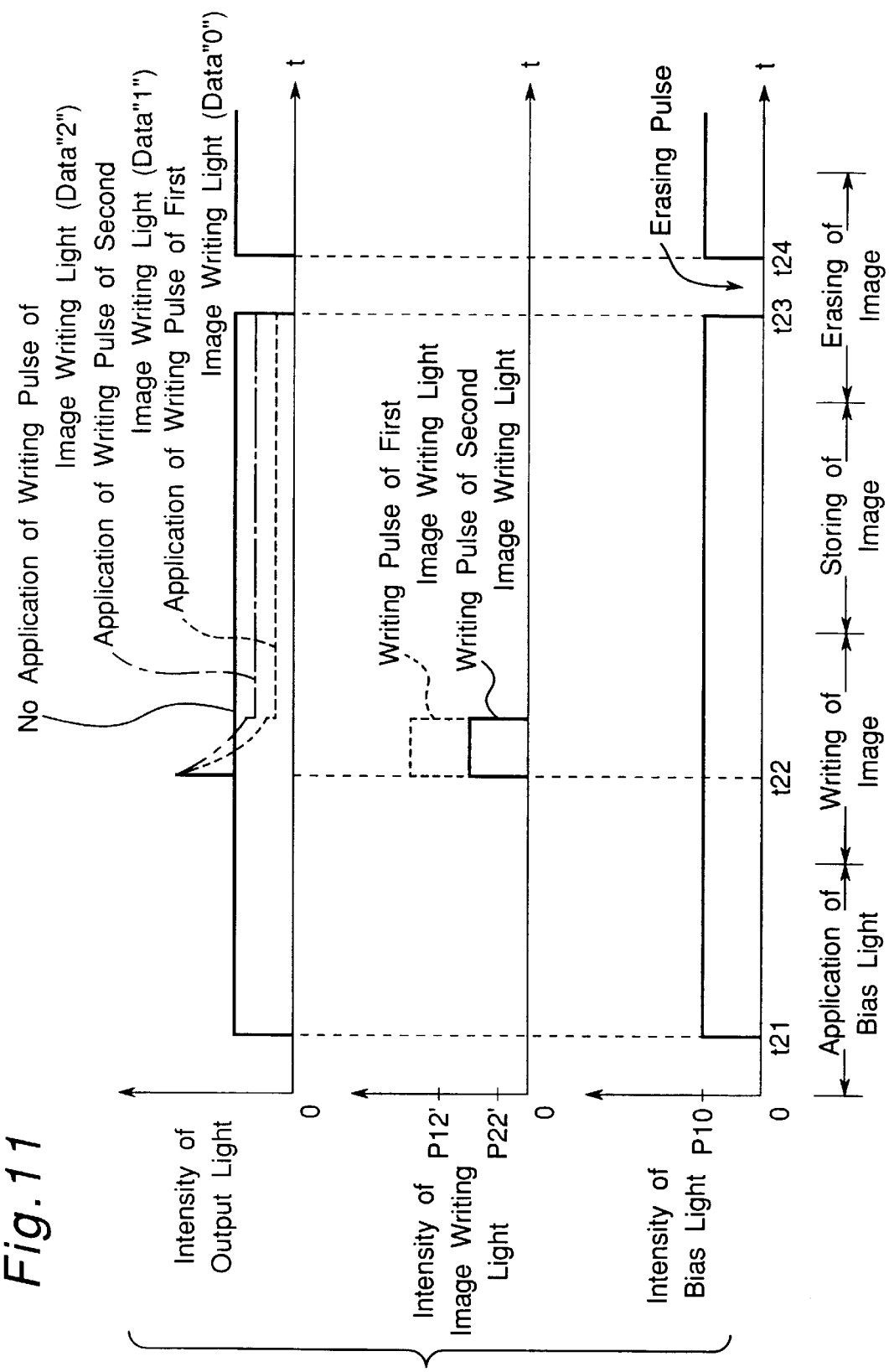
FIG. 11 is a timing chart showing application timings of a bias intensity, an image writing intensity and an output intensity in an image storing operation III of the all optics type semiconductor image storage apparatus shown in FIG. 9.

FIG. 11 is a timing chart showing application timings of a bias intensity, an image writing intensity and an output intensity in an image storing operation III of the all optics type semiconductor image storage apparatus shown in FIG. 9. The image storing operation III will be described below with reference to FIGS. 10A, 10B and 11.

When a writing pulse of a first image writing light is applied at a timing t22 so that the sum of the intensity of the bias light and the writing pulse of the first image writing light exceeds the threshold value P12 while applying a bias light having an intensity P10 at a timing t21, the operating points of the two devices 10a and 10b are at the point E as indicated by the dashed line in FIG. 11. That is, each of the light transmittances of the devices 10a and 10b becomes smaller than 30%, meaning that a dark area comes into existence when the device 10b is viewed on the output side, and this is defined as the writing of data "0". Further, when a writing pulse of a second image writing light is applied at a timing t22 so that the sum of the intensity of the bias light and the writing pulse of the second image writing light exceeds the threshold value P22 but does not exceed the threshold value P12 while applying a bias light having an intensity P10 at a timing t21, the operating point of only the device 10b is at the point E as indicated by the one-dot chain line in FIG. 11. That is, the light transmittance of the device 10a remains at 90%, however, the light transmittance of the device 10b becomes smaller than 30%, meaning that a rather dark area comes into existence when the device 10b is viewed on the output side than that in the case of data "0", and this is defined as the writing of data "1". Further, when no writing pulse of the image writing light is applied, the operating points of both the devices 10a and 10b are at point B. That is, since the light transmittances of the devices 10a and 10b remain at 90%, a significantly bright area comes into existence when the device 10b is viewed on the output side, and this is defined as the writing of data "2".

Figure 12A:
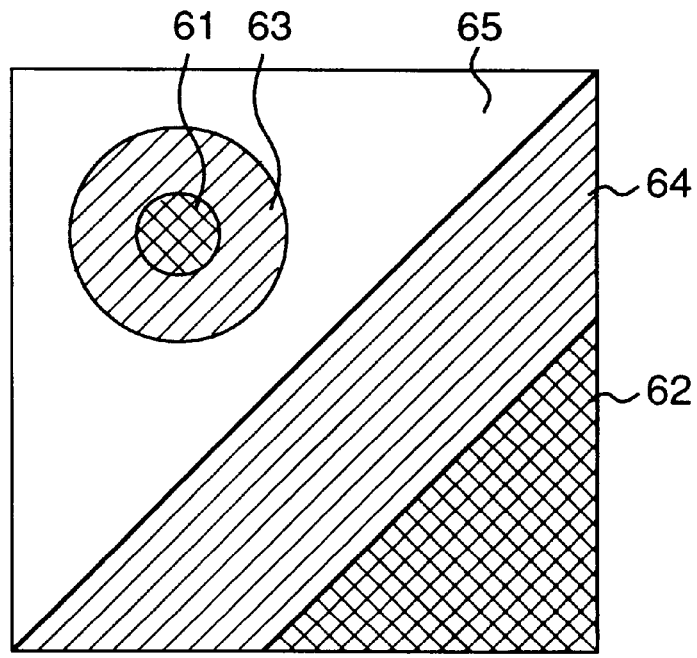
FIG. 12A is a front view showing an image of an image writing light inputted in the all optics type semiconductor image storage apparatus shown in FIG. 9.
Figure 12B:
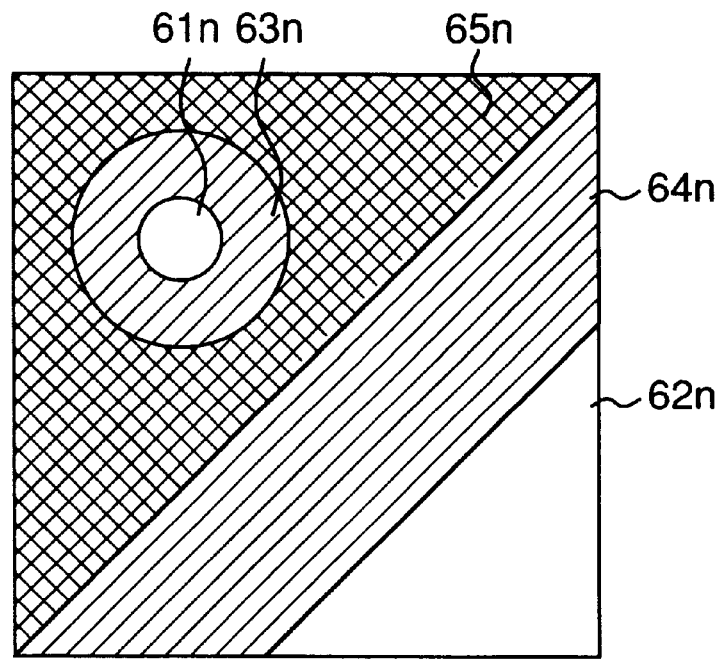
FIG. 12B is a front view showing an image of the image writing light written in the all optics type semiconductor image storage apparatus shown in FIG. 9.
Figure 13:
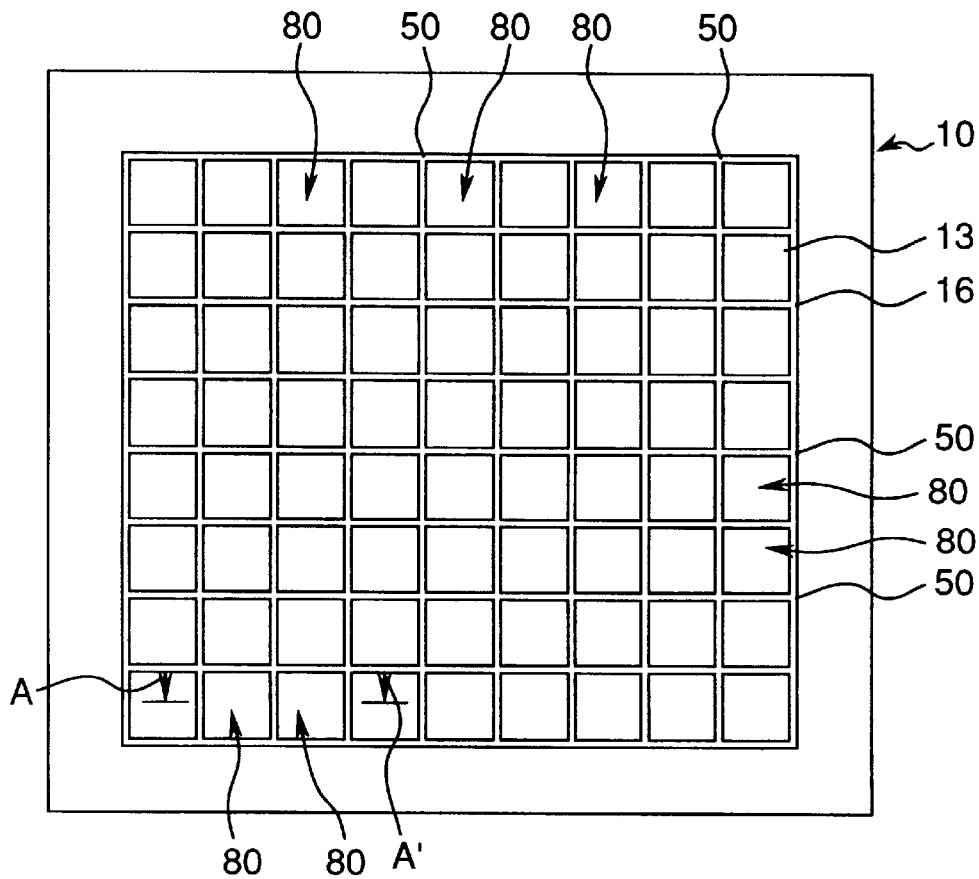
FIG. 13 is a plan view of a third preferred embodiment showing a carrier confinement structure for forming a plurality of images in a lattice form in the all optics type semiconductor image storage apparatus shown in FIG. 9.

Further, by applying an erasing pulse for erasing the bias light at a timing t23, each image stored in the device 10a and/or 10b is erased, and the operating points of the devices 10a and 10b return to the origin via the point A. Even when the bias light is applied again, the image in the dark area is not displayed so long as an image writing light exceeding the threshold value P12 or P22 is applied. Therefore, as shown in FIGS. 9 and 11, an image having a gray scale of three steps can be stored. For example, when an image writing light as shown in FIG. 12A is applied and stored in the second preferred embodiment, a negative image as shown in FIG. 12B can be seen on the output side of the device 10b. In FIG. 12, the reference numerals 61 and 62 denote black portions of the image, the reference numerals 63 and 64 denote gray portions of the image, and the reference numeral 65 denotes a white portion of the image. In FIG. 13, the reference numerals 61n and 62n denote a negative portion of the black portion of the image, the reference numerals 63n and 64n denote the negative portion of the gray portion of the image, and the reference numeral 65n denotes a negative portion of the white portion of the image.

Figure 14:
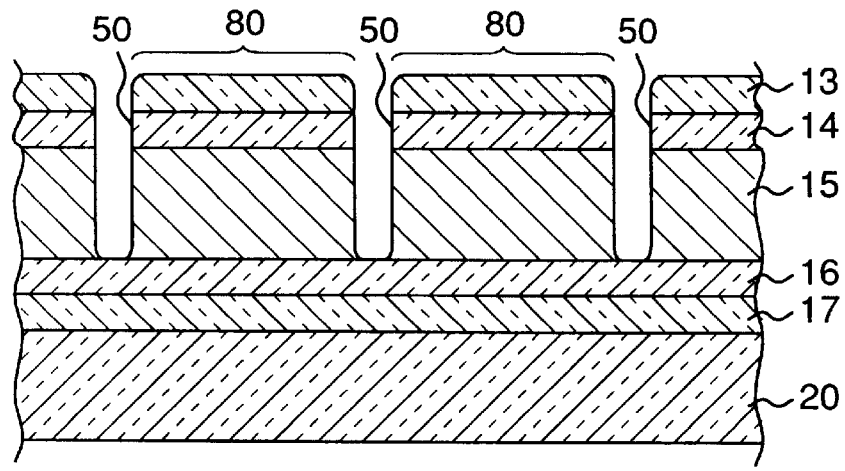
FIG. 14 is a longitudinal sectional view taken along a line A–A' of FIG. 13.

FIG. 13 is a plan view of a third preferred embodiment showing a carrier confinement structure for forming a plurality of lattice-shaped pixels in the all optics type semiconductor image storage apparatus shown in FIG. 9. FIG. 14 is a longitudinal sectional view taken along a line A–A' in FIG. 13. This third preferred embodiment is characterized in that a groove 50 is formed by the wet etching method or the dry etching method so that the groove 50 penetrates at least the cap layer 13, the buffer layer 14 and the superlattice layer 15 in the direction of thickness of the layers (no groove 50 is formed in the carrier confinement layer 16) so as to form a plurality of pixels in a matrix form as shown in FIG. 13 in the device 10 employed in each of the first and second preferred embodiments. The groove 50 may be subsequently used as a protecting film by filling a dielectric material such as polyimide and SiN or the like by the crystal growth method. In this case, the distance between adjacent two grooves 50 is 1 μm to 10 μm, and the width of the groove 50 is about 50 nm to 100 nm. With the above-mentioned arrangement, carriers having an identical operating point are confined in each pixel area 80 enclosed by the grooves 50. Therefore, the resolution of the image to be stored can be improved further than that in the first and second preferred embodiments.

It is to be noted that, in the first or second preferred embodiment wherein no such groove 50 as in the third preferred embodiment is formed, the carrier confinement effect is substantially independent so long as the pixels of the density image pattern to be stored are put apart from each other by a distance of, for example, 100 nm. Therefore, a smaller pixel than that in the prior arts can be formed, so that the resolution of the image to be stored can be improved.

Figure 15:
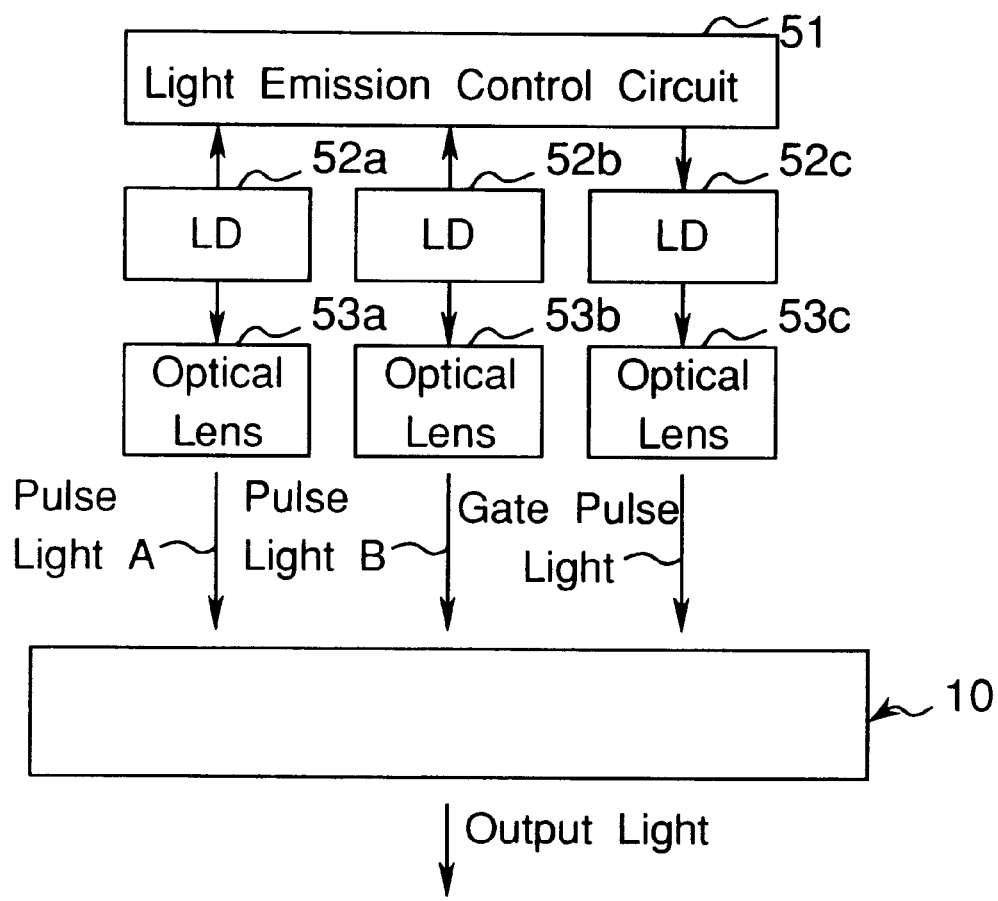
FIG. 15 is a longitudinal sectional view with a block diagram of an all optics type semiconductor logical operation apparatus employing a superlattice semiconductor device according to a fourth preferred embodiment of the present invention.

FIG. 15 is a longitudinal sectional view with a block diagram of an all optics type semiconductor logical operation apparatus employing a superlattice semiconductor device 10 according to a fourth preferred embodiment of the present invention. The device 10 is constructed in a manner similar to that of the devices of the first and second preferred embodiments. The all optics type semiconductor logical operation apparatus of the fourth preferred embodiment is characterized in that at least two input lights having respective logic values are made incident into the superlattice semiconductor device 10 to execute a predetermined logical operation and an output light representing the result of the logical operation is outputted from the superlattice semiconductor device 10.

Referring to FIG. 15, a light emission control circuit 51 controls the emission intensity or the emission intensity and the emission time interval of laser diodes 52*a* and 52*b* for emitting pulse lights A and B, and also controls the emission intensity or the emission intensity and the emission time interval of a laser diode 52*c* for emitting a gate pulse light. The pulse light A outputted from the laser diode 52*a* is collimated by an optical lens 53*a* implemented by, for example, a convex lens so that the light is incident onto the whole incident surface of the cap layer 13 of the device 10 and thereafter made to be incident perpendicularly on the incident surface. The pulse light B outputted from the laser diode 52*b* is collimated by an optical lens 53*b* implemented by, for example, a convex lens so that the light is incident onto the whole incident surface of the cap layer 13 of the device 10 and thereafter made to be incident perpendicularly on the incident surface. The gate pulse light outputted from the laser diode 52*c* is collimated by an optical lens 53*c* implemented by, for example, a convex lens so that the light is incident onto the whole incident surface of the cap layer 13 of the device 10, and thereafter, is incident perpendicularly on the incident surface.

It is permitted to produce a two-dimensional logic gate only by light, utilizing the above-mentioned device 10. Conditions and operation of the all optics type semiconductor logical operation apparatus of the fourth preferred embodiment used as a logical operation device will be described below.

Figure 16:
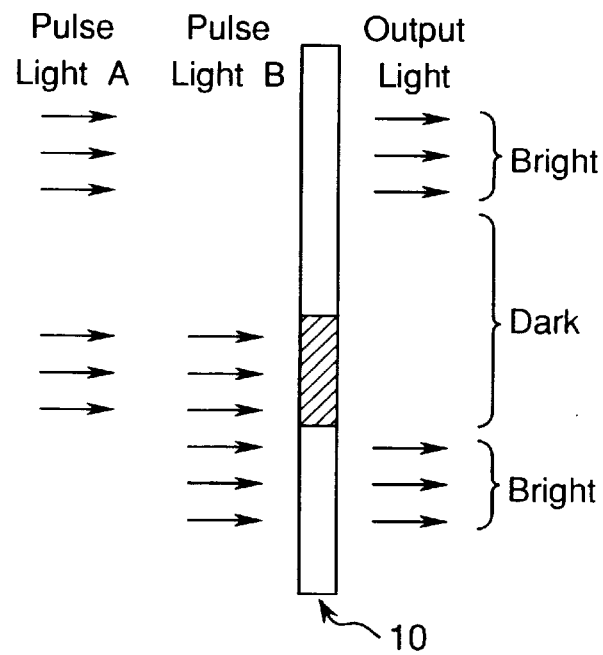
FIG. 16 is a longitudinal sectional view showing an operation of an XOR gate device employing the all optics type semiconductor logical operation apparatus shown in FIG. 15.
Figure 17:
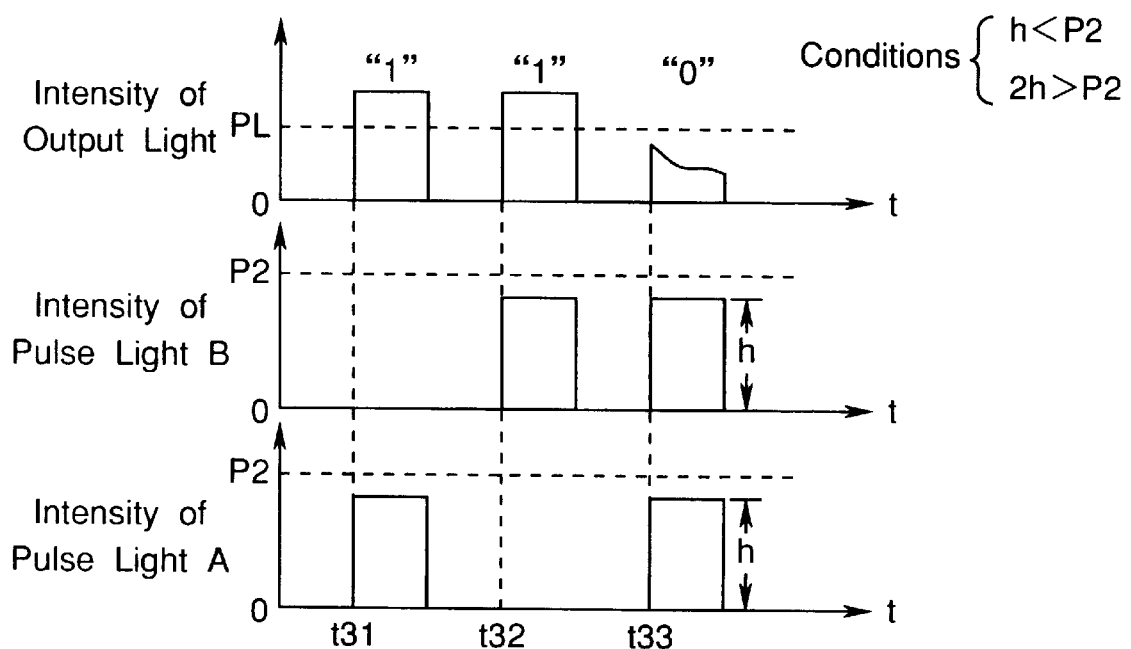
FIG. 17 is a timing chart showing an application timings of intensities of pulse lights A and B and an output light in the operation of the XOR gate device shown in FIG. 16.

FIG. 16 is a longitudinal sectional view showing an operation of an XOR gate device employing the all optics type semiconductor logical operation apparatus shown in FIG. 15. FIG. 17 is a timing chart showing application timings of the intensities of pulse lights A and B and an output light in the operation of the XOR gate device shown in FIG. 16. In this case, the intensity h of the pulse light A or B is smaller than the threshold value P2 of the device 10, whereas the sum 2h of the intensities of the two pulse lights A and B is set greater than the threshold value P2. The operation of the all optics type semiconductor logical operation apparatus under the thus set conditions is as shown in FIG. 17 and Table 1. In this case, R represents the logic value of the output light, and so forth.

TABLE 1

| A | B | R |
|---|---|---|
| 0 | 0 | 0 |
| 0 | 1 | 1 |
| 1 | 0 | 1 |
| 1 | 1 | 0 |

The two pulse lights A and B are simultaneously applied as shown in FIG. 17. Each of the pulse lights cannot singly change the state of the device 10 from the transparent state to the absorption state. However, when the two pulse lights A and B are applied simultaneously, the sum of the intensities exceeds the threshold value P2, and therefore, the operating point is located at the point E. In other words, the area to which one pulse light A or B is applied allows the light to pass therethrough, and the area to which the two pulse lights A and B are simultaneously applied comes to have the absorption state to inhibit the light from passing therethrough. That is, the above arrangement constitutes an XOR logic gate as shown in FIG. 17 and Table 1.

Figure 18:
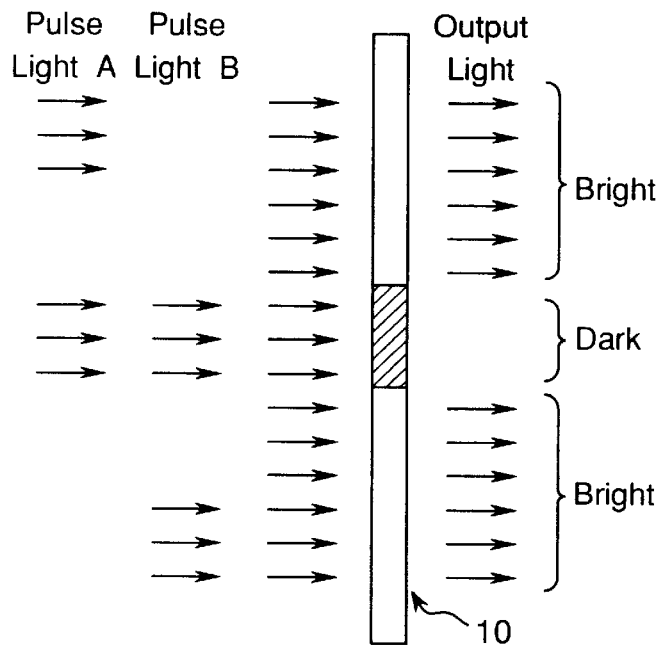
FIG. 18 is a longitudinal sectional view showing an operation of a gated NAND gate device employing the all optics type semiconductor logical operation apparatus shown in FIG. 15.
Figure 19:
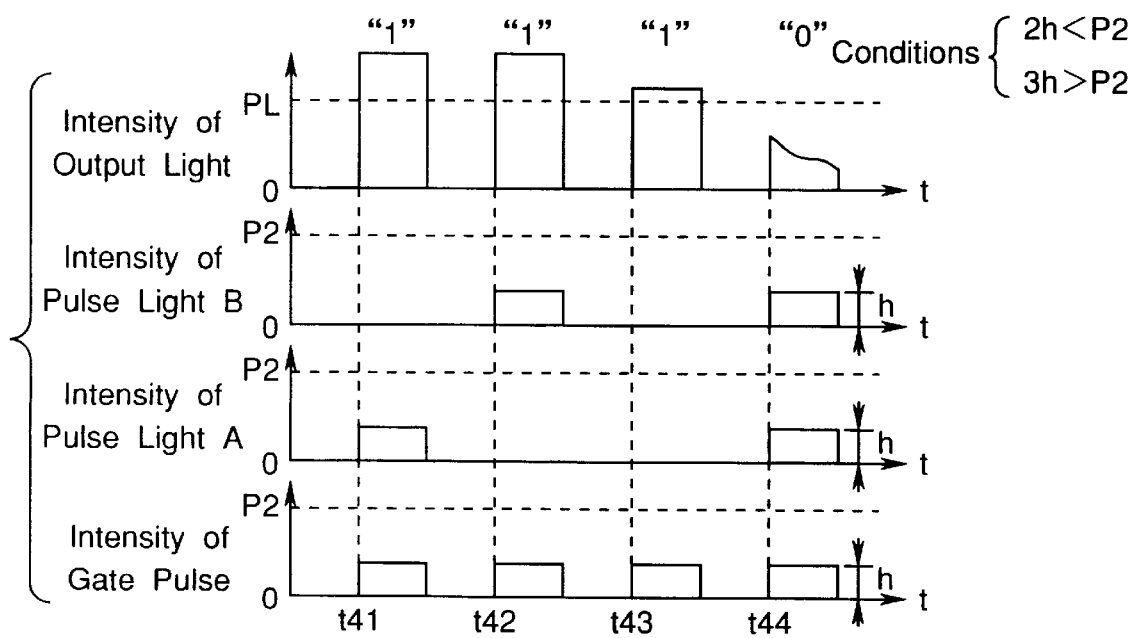
FIG. 19 is a timing chart showing application timings of intensities of a gate pulse light, pulse lights A and B and an output light in the operation of the gated NAND gate device shown in FIG. 18.

FIG. 18 is a longitudinal sectional view showing an operation of a gated NAND gate device employing the all optics type semiconductor logical operation apparatus shown in FIG. 15. FIG. 19 is a timing chart showing application timings of the intensities of a gate pulse light, pulse lights A and B and an output light in the operation of the gated NAND gate device shown in FIG. 18. In this case, the intensities of the pulse lights are set so that the sum 2h of the intensities of the two pulse lights is smaller than the threshold value P2 of the device 10, and the sum 3h of the three pulse lights is greater than the threshold value P2. The operation of the all optics type semiconductor logical operation apparatus under the thus set conditions is as shown in FIG. 19 and Table 2.

TABLE 2

| When the gate pulse = "1" | | |
|---|---|---|
| A | B | R |
| 0 | 0 | 1 |
| 0 | 1 | 1 |
| 1 | 0 | 1 |
| 1 | 1 | 0 |

In the present case, the operation is basically the same as that of the XOR gate, and the gate pulse light is further applied in this case. Each of the pulse lights cannot singly change the state of the device 10 from the transparent state to the absorption state. Also, the area to which only the gate pulse light is applied comes to have the transparent state. The area to which the two pulse lights are applied comes to have the absorption state to inhibit the light from passing therethrough. That is, the above arrangement constitutes a gated NAND logic gate as shown in FIG. 10 and Table 3.

Figure 20:
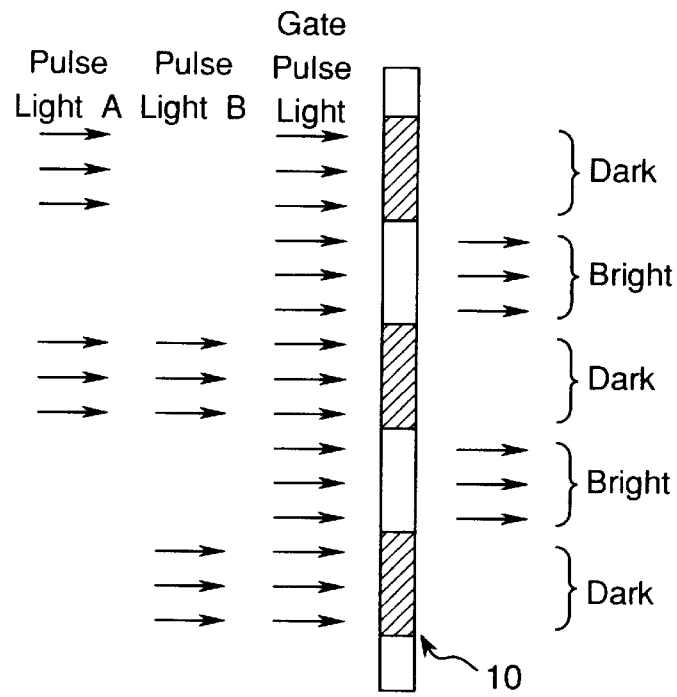
FIG. 20 is a longitudinal sectional view showing an operation of a gated NOR gate device employing the all optics type semiconductor logical operation apparatus shown in FIG. 15.
Figure 21:
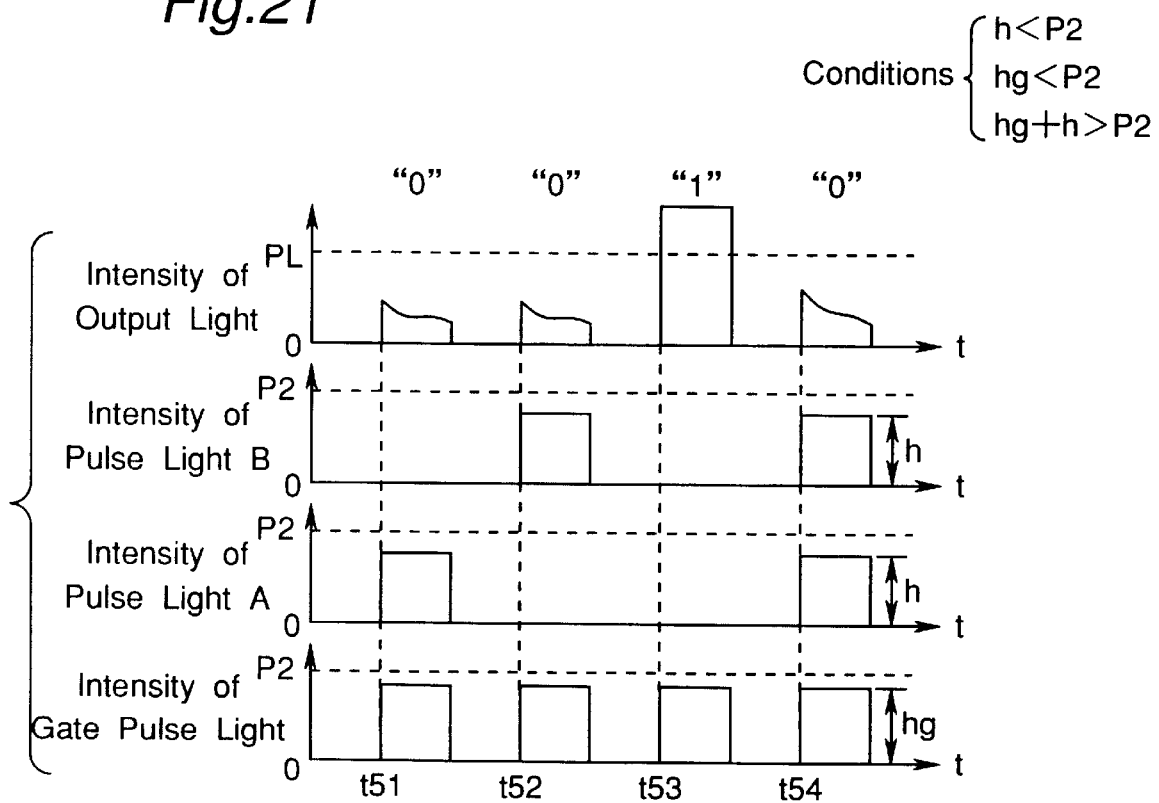
FIG. 21 is a timing chart showing application timings of intensities of a gate pulse light, pulse lights A and B and an output light in the operation of the gated NOR gate device shown in FIG. 20.

FIG. 20 is a longitudinal sectional view showing an operation of a gated NOR gate device employing the all optics type semiconductor logical operation apparatus shown in FIG. 15. FIG. 21 is a timing chart showing application timings of the intensities of a gate pulse light, pulse lights A and B and an output light in the operation of the gated NOR gate device shown in FIG. 20. In this case, the intensities of the pulse lights are set so that the intensity h of one pulse light A or B or the intensity hg of the gate pulse light is smaller than the threshold value P2 of the device 10, and the sum of the intensity hg of the gate pulse light and the intensity h of the pulse light A or B is greater than the threshold value P2. The operation of the all optics type semiconductor logical operation apparatus under the thus set conditions is as shown in FIG. 21 and Table 3.

TABLE 3

| When the gate pulse = "1" | | |
|---|---|---|
| A | B | R |
| 0 | 0 | 1 |
| 0 | 1 | 0 |
| 1 | 0 | 0 |
| 1 | 1 | 0 |

In the present case, the operation is basically the same as that of the gated NAND gate, whereas the intensity of the gate pulse is made strong enough to be able to perform switching by applying one pulse light. The light cannot pass through the device 10 in the area to which one or two pulse lights A or/and B are applied. In the area to which only the gate pulse light is applied, light can pass through the device 10. That is, the above arrangement constitutes a gated NOR logic gate as shown in FIG. 21 and Table 3.

By using the above-mentioned three logic gates, all the logic circuits can be constructed, and therefore, the all optics type semiconductor logical operation apparatus capable of executing the logical operation only by a light signal can be constructed.

According to the superlattice semiconductor device 10 of the above-mentioned preferred embodiments, it is acceptable to grow the device on a patterned GaAs semiconductor substrate 20 in a checkers or tiled form or to pattern the device in a checkers or tiled form after the device is grown in order to reduce the drift of the carriers generated by the excitation light in the lateral direction due to a potential difference between its portion having a high density and its portion having a low density around the portion. Due to the reduction of the drift, the excitation light necessary for switching the superlattice semiconductor device 10 can be reduced.

Furthermore, it is acceptable to form side by side a plurality of devices 10 of the first preferred embodiment, the second preferred embodiment and/or the third preferred embodiment on one dielectric substrate. Further, although the optical intensity is mentioned in each of the above-mentioned preferred embodiments, an optical power may substitute therefor.

Figure 22:
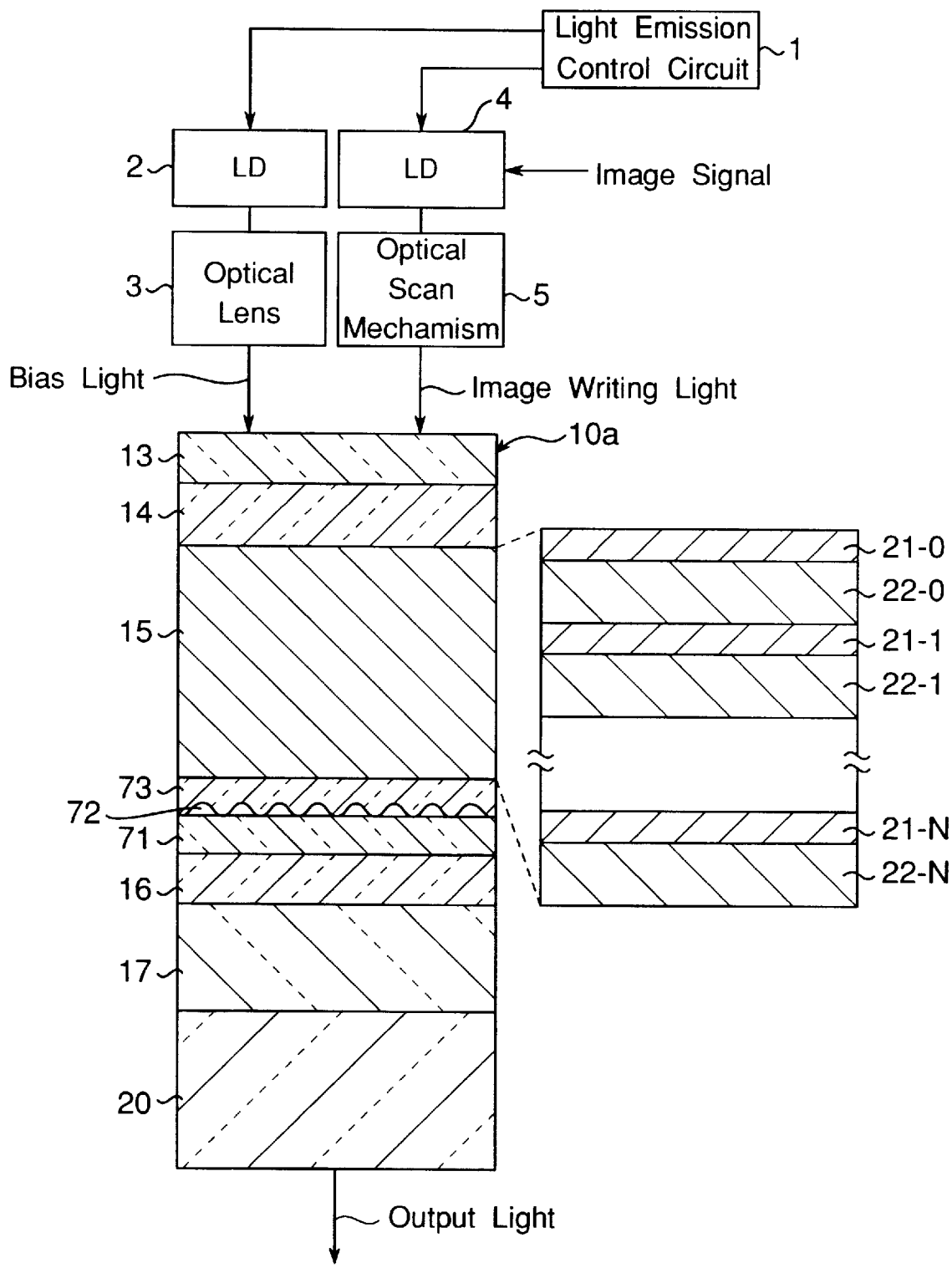
FIG. 22 is a longitudinal sectional view with a block diagram of an all optics type semiconductor image storage apparatus employing a quantum dot of a superlattice semiconductor device according to a modified preferred embodiment of the present invention.

FIG. 22 is a longitudinal sectional view with a block diagram of an all optics type semiconductor image storage apparatus employing a quantum dot of a superlattice semiconductor device 10a according to a modified preferred embodiment of the present invention. This modified preferred embodiment differs from the first preferred embodiment shown in FIG. 1 in that a quantum dot layer 72 interposed between two buffer layers 71 and 73 is formed between the carrier confinement layer 16 and the superlattice layer 15.

This modified preferred embodiment can be fabricated as follows. When a GaAs buffer layer 71 having a thickness of 50 Å is formed on the carrier confinement layer 16 and thereafter two single layers made of InAs are formed at an elevated temperature of 560° C., the two single layers are momentarily transformed into a plurality of island-shaped quantum dots each having a diameter of about 20 nm to 50 nm. Consequently, the transformed quantum dots spread two-dimensionally on the surface of the buffer layer 71, and there is formed a quantum dot layer 72 comprising quantum dots distributed preferably in a lattice form. Further, there is formed the GaAs buffer layer 73 having a thickness of 100 Å for formation of a flat surface on the quantum dot layer 72, and thereafter, the above-mentioned superlattice layer 15 is formed. This fabricating method is known to those skilled in the art, and is disclosed in a prior art reference document 4 of J.-Y. Marzin et al. "Photoluminescence of single InAs quantum dots obtained by self-organized growth on GaAs", Physical Review Letters, Vol. 73, pp.716, 1994".

In the superlattice semiconductor device 10a having the quantum dots constructed as above, electrons are trapped in respective quantum dots, while holes operate as accumulated in the superlattice layer 15 in the vicinity of the carrier confinement layer 14 by the Coulomb force. Therefore, each quantum dot can operate as a pixel for storing pixel data of an image. With this arrangement, the resolution in storing an image can be significantly improved. The present modified preferred embodiment can be applied with the first preferred embodiment and the second preferred embodiment. In the second preferred embodiment, the number of bits in the logical operation can be increased.

As described above, the superlattice semiconductor devices 10 and 10a of the present preferred embodiments utilize the internal electric field by virtue of the piezoelectric effect. Therefore, a lot of images can be subjected to parallel switching and storage with a wafer which requires no external power source for applying an electric field, thereby allowing an information parallel processing optical device to be achieved. Furthermore, since a semiconductor superlattice is employed and the transmission and absorption of light is utilized, a fast switching speed is achieved. Furthermore, by using a plurality of quantum dots of the quantum dot layer 72, the resolution in storing an image can be remarkably improved.

In the first preferred embodiment, an image can be stored wholly by a light signal without using any electric signal. Furthermore, an image can be stored at a higher speed than that in the prior art. Furthermore, the resolution in storing an image can be improved further than that in the prior art.

In the second preferred embodiment, a gray scale image can be written into the apparatus wholly by a light signal without using any electric signal. Furthermore, an image can be stored at a higher speed than that in the prior art. Furthermore, the resolution in storing an image can be improved further than that in the prior art.

In the second preferred embodiment, the stored gray scale image can be erased from the apparatus wholly by a light signal without using any electric signal. Furthermore, an image can be stored at a higher speed than that in the prior art. Furthermore, the resolution in storing an image can be improved further than that in the prior art.

In the fourth preferred embodiment, the logical operation can be executed wholly by a light signal without using any electric signal. Furthermore, the logical operation can be executed at a higher speed than that in the prior art.

In the fourth preferred embodiment, the exclusive OR operation can be executed wholly by a light signal without using any electric signal. Furthermore, the exclusive OR operation can be executed at a higher speed than that in the prior art.

In the fourth preferred embodiment, the gated NAND operation can be executed wholly by a light signal without using any electric signal. Furthermore, the gated NAND operation can be executed at a higher speed than that in the prior art.

In the fourth preferred embodiment, the gated NOR operation can be executed wholly by a light signal without using any electric signal. Furthermore, the gated NOR operation can be executed at a higher speed than that in the prior art.

In the fourth preferred embodiment, the exclusive OR operation can be executed wholly by a light signal without using any electric signal. Furthermore, the exclusive OR operation can be executed at a higher speed than that in the prior art.

In the fourth preferred embodiment, the gated NAND operation can be executed wholly by a light signal without using any electric signal. Furthermore, the gated NAND operation can be executed at a higher speed than that in the prior art.

In the fourth preferred embodiment, the gated NOR operation can be executed wholly by a light signal without using any electric signal. Furthermore, the gated NOR operation can be executed at a higher speed than that in the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor image storage apparatus comprising:
   a superlattice semiconductor device and
   a light emitting device for emitting bias light and image writing light incident on said superlattice, said superlattice semiconductor device including:
      a superlattice layer formed by alternately laminating a barrier layer and a quantum well layer, said superlattice layer being interposed between two carrier confinement layers on a surface of a semiconductor substrate, said surface having an orientation different than the orientation of the rest of said semiconductor substrate,
      said superlattice semiconductor device having a hysteresis characteristic for providing an intensity input at a stable point between predetermined first and second threshold values P1 and P2, in an intensity of light emitted from said superlattice semiconductor device when intensity of light incident on said superlattice semiconductor device is varied.

2. The apparatus as claimed in claim 1, said light emitting device further including:
   a bias light generating circuit for generating said incident bias light of an intensity exceeding said first threshold value P1 but smaller than said second threshold value P2; and
   an image writing light generating circuit for generating said incident image writing light so that a sum of an intensity of said incident bias light and said incident image writing light exceeds said second threshold value P2, thereby storing an image corresponding to said incident image writing light into the semiconductor image storage apparatus.

3. The apparatus as claimed in claim 2, said light emitting device applying a gate pulse to stop said bias light from being incident on said superlattice semiconductor device, thereby erasing said stored image.

4. The apparatus as claimed in claim 1, said light emitting device further including:
   a bias light generating circuit for generating a first incident bias light of an intensity exceeding said threshold value P2, and thereafter, for generating a second bias light incident at an intensity exceeding said first threshold value P1, but smaller than said second threshold value P2; and
   an image writing light generating device for generating said incident image writing light so that a sum of an intensity of said first bias light, second bias light and image writing light exceeds said second threshold value P2, and for stopping said second bias light from being incident on said superlattice semiconductor device in a part of a time period of generation of said incident image writing light, thereby storing an image corresponding to said incident image writing light into the semiconductor image storage apparatus.

5. The apparatus as claimed in claim 4, said light emitting device applying an image erasing light incident on said superlattice semiconductor device so that a sum of the intensity of said incident second bias light and said image erasing light exceeds said second threshold value P2, thereby erasing said stored image.

6. A semiconductor image storage apparatus, comprising:
   a first superlattice semiconductor device; and
   a second superlattice semiconductor device,
   each of said first and second superlattice semiconductor devices including a superlattice layer formed by alternately laminating a barrier layer and a quantum well layer, said superlattice layer being interposed between two carrier confinement layers on a surface of a semiconductor substrate, said surface having an orientation different than the orientation of the rest of the semiconductor substrate,
   wherein each of said first and second superlattice semiconductor devices have a hysteresis characteristic in which there exists a first stable point having a first light transmittance and a second stable point having a second light transmittance lower than said first light transmittance, for providing an intensity input at a stable point between predetermined second and fourth threshold values P11 and P12, in an intensity of light emitted from said first superlattice semiconductor device when intensity of light incident on said first superlattice semiconductor device is varied,
   and for providing an intensity at a stable point between a first threshold value P21 smaller than said second threshold value P11 and a third threshold value P22 exceeding said second threshold value P11, but smaller than said fourth threshold value P12, in an intensity of light emitted from said second superlattice semiconductor device when intensity of light incident said second superlattice semiconductor device is varied.

7. The apparatus as claimed in claim 6, further including:
   a bias light generating circuit for generating a bias light incident on each of said superlattice semiconductor devices at an intensity exceeding said second threshold value P11, but smaller than said third threshold value P22 and
   an image writing light generating circuit for generating a first image writing light incident on each of said superlattice semiconductor devices, so that a sum of an intensity of said bias light and said first image writing light exceeds said fourth threshold value P12, thereby storing an image corresponding to said first image writing light into the semiconductor image storage apparatus at a first light transmittance, and for generating a second image writing light incident on each of said superlattice semiconductor devices so that a sum of the intensity of said bias light and said second image writing light exceeds said third threshold value P22, but is smaller than said fourth threshold value P12, thereby storing another image corresponding to said second image writing light into the semiconductor image storage apparatus at a second light transmittance.

8. The apparatus as claimed in claim 7, further including:

an image erasing control circuit for controlling the bias light generating means for stopping the bias light from being incident on said first and second superlattice semiconductor devices, thereby erasing said stored image.

9. The apparatus as claimed in claim 1, further including grooves formed so as to penetrate said superlattice layer interposed between said two carrier confinement layers in the direction of thickness, thereby forming a plurality of pixel areas.

10. The apparatus as claimed in claim 6, further including grooves formed so as to penetrate said superlattice layer interposed between said two carrier confinement layers in the direction of thickness, thereby forming a plurality of pixel areas.

11. The apparatus as claimed in claim 1, further including a first buffer layer, a quantum dot layer and a second buffer layer, each layer interposed between at least one carrier confinement layer and said superlattice layer, said quantum dot layer further including a plurality of quantum dots corresponding to a plurality of pixel areas.

12. The apparatus as claimed in claim 6, further including a first buffer layer, a quantum dot layer and a second buffer layer, each layer interposed between at least one carrier confinement layer and said superlattice layer, said quantum dot layer further including a plurality of quantum dots corresponding to a plurality of pixel areas.

13. A method for storing an image for use in a semiconductor image storing apparatus having a superlattice semiconductor device, comprising:

generating a bias light to be incident on the superlattice semiconductor device, said bias light having an intensity exceeding a first threshold value P1, but smaller than a second threshold value P2; and generating an image writing light to be incident on the superlattice semiconductor device so that the sum of the intensity of said bias light and said image writing light exceeds said second threshold value P2, thereby storing an image corresponding to said image writing light into the semiconductor image storage apparatus.

14. The method according to claim 13, further including, stopping said bias light from being incident on said superlattice semiconductor device, thereby erasing said stored image.

15. A method for storing an image for use in a semiconductor image storing apparatus having a superlattice semiconductor device, comprising:

generating a first bias light to be incident on the superconductor device, said first bias light having an intensity exceeding a second threshold value P2;

generating a second bias light to be incident on the superlattice semiconductor device, said second bias light having an intensity exceeding a first threshold value P1 but smaller than said second threshold value P2;

generating an image writing light incident on said superlattice semiconductor device so that the sum of the intensity of said second bias light and said image writing light exceeds said second threshold value P2; and stopping said second bias light from being incident on said superlattice semiconductor device in a part of a time period for generation of said image writing light, thereby storing an image corresponding to said image writing light into the semiconductor image storage apparatus.

16. The method according to claim 15, further including, generating an image erasing light incident into the superlattice semiconductor device so that the sum of the intensity of said second bias light and said image erasing light exceeds said second threshold value P2, thereby erasing said stored image.

17. A method for storing an image for use in a semiconductor image storage apparatus having first and second superlattice semiconductor devices, comprising:

forming said first superlattice semiconductor device on said second superlattice semiconductor device, wherein each of said first and second superlattice semiconductor devices have a hysteresis characteristic, in which there exist a first stable point having a first light transmittance and a second stable point having a second light transmittance lower than said first light transmittance, for providing an intensity input at a stable point between predetermined second and fourth threshold values P11 and P12, in an intensity of light emitted from said first superlattice semiconductor device when intensity of light incident on said first superlattice semiconductor device is varied, generating a bias light to be incident on each of said superlattice semiconductor devices, said bias light having an intensity exceeding said second threshold value P11, but smaller than said third threshold value P22;

generating a first image writing light incident on each of said superlattice semiconductor devices so that a sum of an intensity of said bias light and said first image writing light exceeds said fourth threshold value P12, thereby storing an image corresponding to said first image writing light into the semiconductor image storage apparatus at a first light transmittance; and generating a second image writing light incident on each of said superlattice semiconductor devices so that a sum of the intensity of said bias light and said second image writing light exceeds said third threshold value P22, but is smaller than said fourth threshold value P12, thereby storing an image corresponding to the second image writing light into the semiconductor image storage apparatus at a second light transmittance.

18. The method according to claim 17, further including, stopping said bias light from being incident on each of said superlattice semiconductor devices, thereby erasing said stored image.

19. A semiconductor logical operation apparatus having a superlattice semiconductor device, comprising:

a first input light;

a second input light, said first and second input lights to be incident on said superlattice semiconductor device;

a logical operation device for performing a predetermined logical operation to provide said first and second input lights, each input light having respective logic values, such that they are incident on said superlattice semiconductor device, thereby outputting light representing a result of said logical operation.

20. The apparatus as claimed in claim 19, wherein intensities of each of said first and second input lights are smaller than a threshold value, and wherein a sum of the intensity of said first and second input lights exceed said threshold value, and wherein said logical operation device outputs a light representing a result of an exclusive OR operation when said first and second input lights incident on to said superlattice semiconductor device.

21. The apparatus as claimed in claim 19, wherein a sum of intensities of two lights selected from the group consisting of said first input light, said second input light and a gate light is smaller than said second threshold value wherein a sum of the intensities of said first input light, second input light and gate light exceeds said threshold value, and wherein said logical operation device outputs light representing an operation result of a gated NAND gate device from said superlattice semiconductor device when said first and second input lights and said gate light are incident on said superlattice semiconductor device.

22. The apparatus as claimed in claim 19, wherein each of intensities of said first input light, said second input light and a gate light is smaller than said threshold value, and wherein a sum of the intensity of said gate light and said first or second input light exceeds said threshold value, and wherein said logical operation device outputs light representing an operation result of a gated NOR gate device from said superlattice semiconductor device when said first and second input lights and said gate light are incident on said superlattice semiconductor device.

23. A logical operation method for use in a semiconductor logical operation apparatus having a superlattice semiconductor device, comprising:

inputting first and second input lights to said superlattice semiconductor device; and outputting light representing a result of an exclusive OR operation from said superlattice semiconductor device.

24. A logical operation method for use in a semiconductor logical operation apparatus having a superlattice semiconductor device, comprising:

inputting a gate light to said superlattice semiconductor device;

inputting first and second input lights to said superlattice semiconductor device; and outputting light representing an operation result of a gated NAND gate device from said superlattice semiconductor device.

25. A logical operation method for use in a semiconductor logical operation apparatus having a superlattice semiconductor device, comprising:

inputting a gate light to said superlattice semiconductor device;

inputting first and second input lights to said superlattice semiconductor device; and outputting light representing an operation result of a gated NOR gate device from said superlattice semiconductor device.

26. The apparatus of claim 1, said superlattice semiconductor device having a modulation effect on absorbed light by canceling an internal electric field generated by a piezoelectric effect resulting from when said superlattice layer is formed.

27. The apparatus of claim 1, wherein light incident on the superlattice semiconductor device at said first stable point is substantially transmitted, while light incident on the superlattice semiconductor device at said second stable point is substantially prevented from being transmitted, thereby storing an image in the all optics type semiconductor image storing apparatus.

28. The apparatus of claim 1, said hysteresis characteristic further including first and second stable points having corresponding first and second light transmittances, said second light transmittance lower than said first.

29. The apparatus of claim 6, said first and second superlattice semiconductor devices having a modulation effect on absorbed light by canceling an internal electric field generated by a piezoelectric effect resulting from when said superlattice layers are formed.

30. The apparatus of claim 6, wherein said first superlattice semiconductor device is formed on said second superlattice semiconductor device.

31. The method of claim 13, said superlattice semiconductor device further including a superlattice layer formed by the steps of:

alternately laminating a barrier layer and a quantum well layer on at least one carrier confinement layer; and interposing said laminated layers between two carrier confinement layers, at least one of said carrier confinement layers formed on a surface of a semiconductor substrate.

32. The method of claim 31, said superlattice semiconductor device having a modulation effect on absorbed light by canceling an internal electric field generated by a piezoelectric effect resulting from when said superlattice layer is formed.

33. The method of claim 13, said superlattice semiconductor device including a hysteresis characteristic for providing an intensity input at a stable point between said first and second threshold values P1 and P2, in an intensity of light emitted from said superlattice semiconductor device when intensity of light incident on said superlattice semiconductor device is varied.

34. The method of claim 33, said hysteresis characteristic further including first and second stable points having corresponding first and second light transmittances, said second light transmittance lower than said first.

35. The method of claim 15, said superlattice semiconductor device further including a superlattice layer formed by the steps of:

alternately laminating a barrier layer and a quantum well layer on at least one carrier confinement layer; and interposing said laminated layers between two carrier confinement layers, at least one of said carrier confinement layers formed on a surface of a semiconductor substrate.

36. The method of claim 35, said superlattice semiconductor device having a modulation effect on absorbed light by canceling an internal electric field generated by a piezoelectric effect resulting from when said superlattice layer is formed.

37. The method of claim 15, said superlattice semiconductor device including a hysteresis characteristic for providing an intensity input at a stable point between said first and second threshold values P1 and P2, in an intensity of light emitted from said superlattice semiconductor device when intensity of light incident on said superlattice semiconductor device is varied.

38. The method of claim 37, said hysteresis characteristic further including first and second stable points having corresponding first and second light transmittances, said second light transmittance lower than said first.

39. The method of claim 17, each of said first and second superlattice semiconductor devices further including a superlattice layer formed by the steps of:
alternately laminating a barrier layer and a quantum well layer on at least one carrier confinement layer; and
interposing said laminated layers between two carrier confinement layers, at least one of said carrier confinement layers formed on a surface of a semiconductor substrate.

40. The method of claim 39, each of said superlattice semiconductor devices having a modulation effect on absorbed light by canceling an internal electric field generated by a piezoelectric effect resulting from when said superlattice layer is formed.

41. The method of claim 19, said superlattice semiconductor device further including a superlattice layer formed by the steps of:
alternately laminating a barrier layer and a quantum well layer on at least one carrier confinement layer; and
interposing said laminated layers between two carrier confinement layers, at least one of said carrier confinement layers formed on a surface of a semiconductor substrate.

42. The method of claim 41, said superlattice semiconductor device having a modulation effect on absorbed light by canceling an internal electric field generated by a piezoelectric effect resulting from when said superlattice layer is formed.

43. The method of claim 19, said superlattice semiconductor device including a hysteresis characteristic for providing an intensity input at a stable point between said first and second threshold values P1 and P2, in an intensity of light emitted from said superlattice semiconductor device when intensity of light incident on said superlattice semiconductor device is varied.

44. The method of claim 43, said hysteresis characteristic further including first and second stable points having corresponding first and second light transmittances, said second light transmittance lower than said first.

45. The method of claim 23, said superlattice semiconductor device further including a superlattice layer formed by the steps of:
alternately laminating a barrier layer and a quantum well layer on at least one carrier confinement layer; and
interposing said laminated layers between two carrier confinement layers, at least one of said carrier confinement layers formed on a surface of a semiconductor substrate.

46. The method of claim 45, said superlattice semiconductor device having a modulation effect on absorbed light by canceling an internal electric field generated by a piezoelectric effect resulting from when said superlattice layer is formed.

47. The method of claim 23, said superlattice semiconductor device including a hysteresis characteristic for providing an intensity input at a stable point between said first and second threshold values P1 and P2, in an intensity of light emitted from said superlattice semiconductor device when intensity of light incident on said superlattice semiconductor device is varied.

48. The method of claim 47, said hysteresis characteristic further including first and second stable points having corresponding first and second light transmittances, said second light transmittance lower than said first.

49. The method of claim 47, wherein intensities of said first and second input lights individually are smaller than said second threshold value P2, but wherein a sum of intensities of said first and second input lights exceed said second threshold value P2.

50. The method of claim 24, said superlattice semiconductor device further including a superlattice layer formed by the steps of:
alternately laminating a barrier layer and a quantum well layer on at least one carrier confinement layer; and
interposing said laminated layers between two carrier confinement layers, at least one of said carrier confinement layers formed on a surface of a semiconductor substrate.

51. The method of claim 50, said superlattice semiconductor device having a modulation effect on absorbed light by canceling an internal electric field generated by a piezoelectric effect resulting from when said superlattice layer is formed.

52. The method of claim 24, said superlattice semiconductor device including a hysteresis characteristic for providing an intensity input at a stable point between said first and second threshold values P1 and P2, in an intensity of light emitted from said superlattice semiconductor device when intensity of light incident on said superlattice semiconductor device is varied.

53. The method of claim 52, said hysteresis characteristic further including first and second stable points having corresponding first and second light transmittances, said second light transmittance lower than said first.

54. The method of claim 52, wherein a sum of intensities of two lights selected from the group of said first input light, second input light and gate light is smaller than said second threshold value P2, but wherein a sum of intensities of said first input light, second input light and gate light exceed said second threshold value P2.

55. The method of claim 25, said superlattice semiconductor device further including a superlattice layer formed by the steps of:
alternately laminating a barrier layer and a quantum well layer on at least one carrier confinement layer; and
interposing said laminated layers between two carrier confinement layers, at least one of said carrier confinement layers formed on a surface of a semiconductor substrate.

56. The method of claim 55, said superlattice semiconductor device having a modulation effect on absorbed light by canceling an internal electric field generated by a piezoelectric effect resulting from when said superlattice layer is formed.

57. The method of claim 25, said superlattice semiconductor device including a hysteresis characteristic for providing an intensity input at a stable point between said first and second threshold values P1 and P2, in an intensity of light emitted from said superlattice semiconductor device when intensity of light incident on said superlattice semiconductor device is varied.

58. The method of claim 57, said hysteresis characteristic further including first and second stable points having corresponding first and second light transmittances, said second light transmittance lower than said first.

59. The method of claim 57, wherein a sum of intensities of two lights selected from the group of said first input light, second input light and gate light is smaller than said second threshold value P2, but wherein a sum of intensities of said first input light, second input light and gate light exceed said second threshold value P2.

* * * * *